United States Patent [19]
Reese et al.

[11] Patent Number: 5,850,365
[45] Date of Patent: Dec. 15, 1998

[54] SENSE AMPLIFIER WITH INDIVIDUALLY OPTIMIZED HIGH AND LOW POWER MODES

[75] Inventors: Dirk A. Reese, Los Gatos; Myron W. Wong; John C. Costello, both of San Jose, all of Calif.

[73] Assignee: Altera Corporation, San Jose, Calif.

[21] Appl. No.: 772,567

[22] Filed: Dec. 24, 1996

Related U.S. Application Data

[63] Continuation-in-part of Ser. No. 655,209, Jun. 7, 1996, abandoned, which is a continuation of Ser. No. 358,210, Dec. 16, 1994, Pat. No. 5,525,917.

[51] Int. Cl.$^6$ .................................................. G11C 7/02
[52] U.S. Cl. ................... 365/207; 365/205; 365/185.21; 365/226; 327/51
[58] Field of Search .................................... 365/207, 205, 365/185.21, 226; 327/51, 52, 328

[56] References Cited

U.S. PATENT DOCUMENTS

| | | |
|---|---|---|
| 4,609,986 | 9/1986 | Hartmann et al. . |
| 4,617,479 | 10/1986 | Hartmann et al. . |
| 4,677,318 | 6/1987 | Veenstra . |
| 4,713,792 | 12/1987 | Hartmann et al. . |
| 4,774,421 | 9/1988 | Hartmann et al. . |
| 4,857,768 | 8/1989 | Griffith et al. . |
| 4,871,930 | 10/1989 | Wong et al. . |
| 4,899,067 | 2/1990 | So et al. . |
| 4,899,070 | 2/1990 | Ou et al. . |
| 4,912,342 | 3/1990 | Wong et al. . |
| 5,041,746 | 8/1991 | Webster et al. . |
| 5,121,006 | 6/1992 | Pedersen . |
| 5,128,565 | 7/1992 | McClintock et al. . |
| 5,162,679 | 11/1992 | Shen et al. . |
| 5,162,680 | 11/1992 | Norman et al. . |
| 5,220,214 | 6/1993 | Pedersen . |
| 5,260,610 | 11/1993 | Pedersen . |
| 5,260,611 | 11/1993 | Cliff et al. . |
| 5,350,954 | 9/1994 | Patel . |
| 5,371,422 | 12/1994 | Patel et al. . |
| 5,420,823 | 5/1995 | Yonaga et al. ........................... 365/226 |
| 5,457,657 | 10/1995 | Suh ......................................... 365/207 |
| 5,638,333 | 6/1997 | Lee ......................................... 365/205 |

*Primary Examiner*—David Nelms
*Assistant Examiner*—Huan Hoang
*Attorney, Agent, or Firm*—Fish & Neave; Jeffrey H. Ingerman; Douglas A. Cardwell

[57] ABSTRACT

The present invention is a sense amplifier circuit for use with programmable logic devices that provides improved switching time by actively limiting the voltage swing on the bit line which it is sensing, rather than passively sensing the voltage, employs feedback circuits to further improve switching time and may be selectively operated in low power mode without significant reduction in switching speed. Voltage reference control circuitry, comprising variable current limiters controlled by the potential of a supply of reference potential, can be added to improve noise immunity. The circuitry of the supply of reference potential is designed so that its sensitivity to fabrication variations is substantially similar to that of the sense amplifier and so that it adjusts the reference potential accordingly.

27 Claims, 9 Drawing Sheets

SENSE AMPLIFIER WITH INDIVIDUALLY OPTIMIZED HIGH AND LOW POWER MODES

CROSS-REFERENCE TO RELATED APPLICATIONS

This is a continuation-in-part of, commonly assigned U.S. patent application Ser. No. 08/655,209, filed Jun. 7, 1996, now abandoned, which is a continuation of U.S. patent application Ser. No. 08/358,210, filed Dec. 16, 1994, now U.S. Pat. No. 5,525,917.

BACKGROUND OF THE INVENTION

This invention relates to programmable logic devices ("PLDs"), and more particularly to bit line sense amplifiers for PLDs.

Programmable logic devices are well known. Such devices frequently take the form of an array of programmable interconnect elements (often referred to as "cells"). The array can be any size, including a single row, but it is not unusual for such an array to contain hundreds of rows and hundreds of columns. The array is based on a grid of orthogonal signal lines known as "bit lines" and "word lines." The programmable interconnect elements are typically erasable programmable read-only memories ("EPROMs"), such as electrically erasable programmable read-only memories ("EEPROMs") or ultraviolet erasable programmable read-only memories ("UVEPROMs"), although other types of programmable elements may be used. In a row of EPROMs extending in one direction, the gate of each EPROM is connected to a word line, while in an orthogonal row of EPROMs the drain of each EPROM is connected to a bit line. The source of each EPROM is connected to ground, typically through lines running parallel to the bit lines, although they could also run parallel to the word lines. The lines through which the sources are connected to ground, which may not actually be at ground potential, may be referred to as "common source lines," or just "source lines."

A user can "program" a desired bit in the array by placing a sufficient charge on the floating gate of the appropriate EPROM to prevent it from conducting even when its gate voltage (controlled by the word line) is high. Once the desired EPROMs have been programmed, a desired logical output can be obtained for a particular input to selected word lines.

One way of reading the output of the array is by sensing the status of each bit line with a circuit known as a sense amplifier, one of which is provided for each bit line. If none of the EPROMs connected to a particular bit line is conducting ("OFF"), the sense amplifier will indicate a high output. If any of the EPROMs is conducting ("ON"), it will tend to bring the bit line voltage to ground, resulting in a low output.

One tends to think of the EPROMs as switches, so that if any EPROM is conducting, the bit line should be shorted to ground. However, each EPROM has impedance and more importantly, capacitance, so that a conducting EPROM will have to discharge the capacitance of all of the non-conducting EPROMs connected to the same bit line. As a result, the bit line reaches ground faster if there are more EPROMs conducting (a state referred to as "super zero") than if only one is conducting ("weak zero"). Conversely, the transition from a super zero to a high state—i.e., from a state where many EPROMs are conducting to one where none is conducting—is also slow, because the capacitances of the EPROMs must be charged up from a relatively low initial potential, as compared to the transition from a weak zero state to a high state, where the capacitances of the same number of EPROMs must be charged, but from not quite so low an initial potential.

An OFF cell gives a voltage difference between the drain line and the source line large enough for the sense amplifier to sense and output a high. An ON cell gives a voltage difference between the drain line and the source line small enough for the sense amplifier to sense and output a low. The difference in potential between drain line and source line at which the sense amplifier can sense a transition of the state of the cell and make a transition in output state is known as the trip voltage. The speed of a sense amplifier depends on how close the voltage difference between the drain line and the source line is to the trip voltage. The trip voltage for the sense amplifier is the same for high-to-low and low-to-high transitions, except that they are reached from opposite directions.

Many existing sense amplifiers are triggered to output a high or low signal based simply on a particular voltage level on the bit line. These sense amplifiers thus switch more slowly from the high state to the weak zero state than the from high state to the super zero state, and from the super zero state to the high state than from the weak zero state to the high state, because of the difference in elapsed time necessary to reach the switching voltage from the different states.

A particularly effective way to increase the speed of each transition is to bias the voltage difference between the drain line and the source line closer to the appropriate trip voltage (i.e., for the ON-to-OFF transition or the OFF-to-ON transition, depending on the present state) by using feedback. The feedback must prepare the drain line and source line voltages for the upcoming transition, without affecting the previous transition.

The cost of using feedback to gain speed is a reduction of the sense amplifier circuit's immunity to variations in fabrication of the transistors in the device, and the device has reduced immunity to device switching noise. Depending on fabrication conditions, transistors can have higher or lower device conductivity. If the feedback transistors have too high conductivities (sometimes referred to as "strong processing"), feedback causes the sense amplifier to be more susceptible to noise. If the feedback transistors have too low conductivities (sometimes referred to as "weak processing"), the effects of feedback are not strong enough to allow the sense amplifier to switch at its maximum rate.

During normal operation, feedback is used to increase the transition speed. A low power mode provides lower power operation (and a slower transition speed) by causing the feedback and feedback stabilization circuitry to cease conducting, albeit at the cost of increase switching time.

It would be desirable to be able to provide a sense amplifier having switching times that are substantially the same regardless of the initial state of the cell.

It would also be desirable to be able to provide feedback circuitry for limiting the voltage swing on the bit line of a PLD to improve switching speed.

It would further be desirable to be able to provide circuitry for stabilization of the feedback circuitry and to counteract fabrication induced variations in device impedance.

It would still further be desirable to be able to provide a sense amplifier that can be selectively operated in a low power mode.

It would yet also be desirable to provide a sense amplifier that can be selectively operated in a low power mode without significant reduction in switching speed.

SUMMARY OF THE INVENTION

It is an object of this invention to provide a sense amplifier having switching times that are substantially the same regardless of the initial state of the cell.

It is also an object of this invention to provide feedback circuitry for limiting the voltage swing on the bit line of a PLD to improve switching peed.

It is a further object of this invention to provide circuitry for stabilization of the feedback circuitry and to counteract fabrication induced variations in device impedance.

It is a still further object of this invention to provide a sense amplifier that can be selectively operated in a low power mode.

It is yet also an object of this invention to provide a sense amplifier that can be selectively operated in low power mode without significant reduction in switching speed.

In accordance with this invention, there is provided, for use with a linear array of programmable interconnection devices, which programmable interconnection devices share common drain and source lines and have individual gate lines, a first preferred embodiment of a sense amplifier for determining the interconnection state of the array. The sense amplifier includes a supply of fixed positive electrical potential, a supply of ground electrical potential, a signal node, a feedback node and an output node. A first voltage inverter is connected between the signal node and the output node. A second voltage inverter is connected between the output node and the feedback node. A first variable current limiter is connected between the signal node and the supply of fixed positive electrical potential. A second variable current limiter is connected between the signal node and the source line and is controlled by potential on the drain line. A third variable current limiter is connected between the source line and the supply of ground electrical potential and is controlled by potential on the drain line. A fourth variable current limiter is connected between the drain line and the source line and is controlled by potential at the output node. A fifth variable current limiter is connected between the supply of fixed positive electrical potential and the drain line and is controlled by potential at the feedback node. A sixth variable current limiter is connected between the source line and the supply of ground electrical potential and is controlled by potential at the feedback node. A variable pull-up limits potential on the drain line and controls the first variable current limiter responsive to potential on the drain line.

When none of the programmable interconnections is conducting, potential on the drain line is limited to a first positive potential (about 1.2 volts) which is less than the fixed positive electrical potential. The first positive potential is sufficient to cause the second and third variable current limiters to conduct, such that: (i) potential on the source line is a second positive potential (about 0.2 volt) which is closer to ground potential than to potential of the supply of fixed positive electrical potential; (ii) potential at the signal node is limited to a third positive potential (about 0.75 volt) which is greater than the second positive potential such that the first voltage inverter causes potential on the output node to be at substantially the potential of the supply of fixed positive electrical potential (about 4.5 volts); and (iii) the fourth variable current limiter responds to the output node potential by conducting, thereby holding the drain line at the first positive potential and the source line at the second positive potential, limiting possible changes in potential on the drain and source lines, thereby minimizing switching time from a state when none of the programmable interconnections is conducting to a state when at least one of the programmable interconnections is conducting.

When at least one of the programmable interconnections begins to conduct, potential on the drain line falls to a fourth positive potential (about 0.95 volt) insufficient to cause the second and third variable current limiters to conduct, such that (i) the signal node is isolated from the supply of ground electrical potential; (ii) the variable pull-up responds to the fourth positive potential by causing the first variable current limiter to conduct, thereby raising the signal node to substantially the potential of the supply of fixed positive electrical potential (about 4.7 volts); (iii) the first inverter responds by lowering the output node to ground potential; and (iv) the fourth variable current limiter responds to the output node potential by ceasing to conduct, the feedback node potential is sufficient to cause the fifth and sixth variable current limiters to conduct only after potential on the output node has substantially reached ground potential, the fifth variable current limiter when conducting raises the drain line potential to a fifth positive potential (about 1.1 volts) less than the first positive potential and greater than the fourth positive potential, the sixth variable current limiter when conducting raises the source line potential to a sixth positive potential (about 0.3 volt) greater than the second positive potential and less than the fourth positive potential, limiting maximum possible change in potential on the drain and source lines, thereby minimizing switching time from a state when at least one of the programmable interconnections is conducting to a state when none of the programmable interconnections is conducting.

In order to stabilize the feedback circuitry and to increase the first preferred embodiment of the sense amplifier circuit's immunity to fabrication induced variations in variable current limiter device impedance, to the above described sense amplifier can be added a first input node, a seventh variable current limiter, an eighth variable current limiter and a ninth variable current limiter. The seventh variable current limiter is connected between the supply of fixed positive electrical potential and the fifth variable current limiter and is controlled by potential at the first input node, (i) such that conduction of the seventh variable current limiter decreases as potential of the supply of fixed positive electrical potential decreases, and (ii) such that conduction of the seventh variable current limiter increases as potential of the supply of fixed positive electrical potential increases, thereby insulating the drain line from variations in the fifth variable current limiter device impedance, by changing the potential of the supply of fixed electrical potential at the seventh current limiter to compensate. The eighth variable current limiter is connected between the sixth variable current limiter and the supply of ground electrical potential and is controlled by potential at the first input node, such that conduction by the eighth variable current limiter: (i) increases as potential of the supply of ground electrical potential decreases and when the sixth variable current limiter device impedance is low, thereby providing greater potential drop between the source line and the supply of ground electrical potential, and (ii) decreases as potential of the supply of ground electrical potential increases and when the sixth variable current limiter device impedance is high, thereby providing less potential drop between the source line and the supply of ground electrical potential, thereby insulating the source line potential from variations in potential of the supply of ground electrical potential and variations in the sixth variable current limiter device impedance. The ninth variable current limiter is connected between the drain line and the fourth variable current limiter and is controlled by potential at the first input node, such that conduction by the ninth variable current limiter: (i) decreases as the difference in potential between the drain and source lines decreases, and (ii) increases as the difference in potential between the drain and source lines increases. The change in potential at the first input node compensates for variations in device impedance of the fourth variable current limiter.

Optional low power operation is provided for by adding to the above described first preferred embodiment of the sense amplifier circuit a supply of reference potential, a tenth variable current limiter connected between the drain line and a control input of the first variable current limiter and being controlled by potential at the first input node, and a second input node connected to the supply of reference potential. The variable pull-up comprises a cascode connected between the drain line and the supply of fixed positive electrical potential and is controlled by potential at the second input node. When the first input node is selectively connected to ground potential, conduction is absent in the seventh variable current limiter, the eighth variable current limiter, the ninth variable current limiter and the tenth variable current limiter, thereby preventing the fourth variable current limiter, the fifth variable current limiter and the sixth variable current limiter from conducting, thereby providing for low power operation of the sense amplifier. When the first input node is selectively connected to the supply of reference potential, conduction is possible in the fourth, fifth, sixth, seventh, eighth and ninth current limiters, thereby providing for normal operation of the sense amplifier.

The supply of reference potential for use with the first preferred embodiment of the sense amplifier includes: a first reference supply node, a second reference supply node, a third reference supply node, a fourth reference supply node; an output reference supply node. A first reference supply variable current limiter is connected between the supply of fixed positive electrical potential and the first reference supply node and is controlled by potential at the first reference supply node. A second reference supply variable current limiter connected between the first reference supply node and the third reference supply node is controlled by potential at the output reference supply node. A third reference supply variable current limiter connected between the supply of fixed positive electrical potential and the second reference supply node and is controlled by potential at the first reference supply node. A fourth reference supply variable current limiter is connected between the second reference supply node and the fourth reference supply node and is controlled by potential at the third reference supply node. A fifth reference supply variable current limiter connected between the fourth reference supply node and the supply of ground electrical potential and is controlled by potential at the third reference supply node. A sixth reference supply variable current limiter connected between the supply of fixed positive electrical potential and the output reference supply node and is controlled by potential at the third reference supply node. A seventh reference supply variable current limiter is connected between the output reference supply node and the supply of ground electrical potential and is controlled by potential at the third reference supply node. An eighth reference supply variable current limiter is connected between the third reference supply node and the fourth reference supply node and is controlled by potential at the third reference supply node. Potential at the output reference supply node is slightly lower when variable current limiter device impedance is low and slightly higher when variable current limiter device impedance is high.

In accordance with this invention, there is also provided, for use with a linear array of programmable interconnection devices, the programmable interconnection devices sharing common drain and source lines and having individual gate lines, a second preferred embodiment of the sense amplifier for determining the interconnection state of the array. The second preferred embodiment of the sense amplifier includes a supply of fixed positive electrical potential, a supply of ground electrical potential, a signal node, a feedback node, and an output node. A first voltage inverter is connected between the signal node and the output node. A first variable current limiter connected between the signal node and the supply of fixed positive electrical potential and is controlled by potential at the feedback node. A second variable current limiter is connected between the signal node and the source line and is controlled by potential on the drain line. A third variable current limiter is connected between the source line and the supply of ground electrical potential and is controlled by potential on the drain line. A fourth variable current limiter is connected between the supply of fixed positive electrical potential and the feedback node and is controlled by potential at the output node. A first variable pull-up limits potential on the drain line and controls the first variable current limiter responsive to potential on the drain line. A second variable pull-up latches the signal node potential to substantially the fixed positive electrical potential when the output node is substantially at ground potential.

When none of the programmable interconnections is conducting, potential on the drain line is limited to a first positive potential (about 1.4 volts) which is less than the fixed positive electrical potential. The first positive potential is sufficient to cause the second and third variable current limiters to conduct, such that potential on the source line is substantially at ground potential and potential at the signal node is substantially at ground potential such that such first voltage inverter causes potential at the output node to be at the potential of the supply of fixed electrical potential. The fourth variable current limiter responds to increased potential at the output node by ceasing to conduct, thereby limiting the feedback node potential to a second positive potential (4.5 volts), thereby limiting the current available to hold potential on the feedback node to a small nominal value, thereby minimizing switching time from a state when none of the programmable interconnections is conducting to a state when at least one of the programmable interconnections is conducting.

When at least one of the programmable interconnections begins to conduct, potential on the drain line falls to a third positive potential (about 1.0 volt) insufficient to cause the second and third variable current limiters to conduct, thereby isolating the signal node from the supply of ground electrical potential. The first variable pull-up responds to the second positive potential by causing the feedback node potential to decrease from a fourth positive potential (about 4.5 volts) to a fifth positive potential (about 2.3 volts), thereby causing the first variable current limiter to conduct, thereby raising the signal node potential. The first voltage inverter responds to increase in the signal node potential by lowering the output node to ground potential, the second variable pull-up responding to decrease in the output node potential by latching the signal node to potential of the supply of fixed electrical potential. The fourth variable current limiter begins to conduct only after the output node potential has substantially reached ground potential. The effect of the fourth variable current limiter when conducting is to raise the feedback node potential to a sixth positive potential (about 3.8 volts), limiting maximum possible change in potential on the feedback node, thereby minimizing switching time from state when at least one of the programmable interconnections is conducting to state when none of the programmable interconnections is conducting.

The first supply of reference potential for use with the second preferred embodiment of the sense amplifier includes a first reference supply node, a second reference supply node, a third reference supply node, a fourth reference supply node, and a first output reference supply node. A first reference supply variable current limiter is connected between the supply of fixed positive electrical potential and the first reference supply node and is controlled by potential at the first reference supply node. A second reference supply variable current limiter is connected between the first reference supply node and the third reference supply node and is controlled by potential at the first output reference supply node. A third reference supply variable current limiter is connected between the supply of fixed positive electrical potential and the second reference supply node and is controlled by potential at the first reference supply node. A fourth reference supply variable current limiter is connected between the second reference supply node and the fourth reference supply node and is controlled by potential at the third reference supply node. A fifth reference supply variable current limiter is connected between the fourth reference supply node and the supply of ground electrical potential and being controlled by potential at the third reference supply node. A sixth reference supply variable current limiter is connected between the supply of fixed positive electrical potential and the first output reference supply node and is controlled by potential at the third reference supply node. A seventh reference supply variable current limiter is connected between the first output reference supply node and the supply of ground electrical potential and being controlled by potential at the third reference supply node. An eighth reference supply variable current limiter is connected between the supply of fixed positive electrical potential and the first reference supply node and is controlled by potential of the third reference supply node. A feedback circuit reacts to decrease in the second reference supply node potential to cause corresponding decrease in the first output reference supply node potential. A simulator of one of the programmable interconnection devices (a pseudo EPROM cell) is connected between the third reference supply node and the fourth reference supply node.

The second supply of reference potential for use with the second preferred embodiment of the sense amplifier includes: a second output reference supply node, and a voltage divider connected between the second reference supply node and the second output reference supply node. Potential at the first output reference supply node is slightly lower when the variable current limiter device impedance is low and slightly higher when the variable current limiter device impedance is high. Potential at the second output reference supply node is slightly lower when the variable current limiter device impedance is low and slightly higher when the variable current limiter device impedance is high.

Instead of developing the entire switching potential on the bit line (the common drain electrode of the EPROMs), in the present invention half of the switching potential is developed on the drain line and the other half of the switching potential is developed on the source line. The two smaller potential differences result in quicker charging of the respective capacitances while the sum of the two potential differences is detected by the sense amplifier.

In accordance with this invention, there is also provided, for use with a linear array of programmable interconnection devices, the programmable interconnection devices sharing common drain and source lines and having individual gate lines, a preferred embodiment of the sense amplifier for determining the interconnection state of the array. The third preferred embodiment of the sense amplifier includes a supply of fixed positive electrical potential, a supply of ground electrical potential, a signal node, a feedback node, a low-power set node and an output node. A voltage inverter is connected between the signal node and the output node. A first variable current limiter connected between the signal node and the supply of fixed positive electrical potential and is controlled by potential at the feedback node. A second variable current limiter is connected between the signal node and the source line and is controlled by potential on the drain line. A third variable current limiter is connected between the source line and the supply of ground electrical potential and is controlled by potential on the drain line. A fourth variable current limiter is connected to the supply of fixed positive electrical potential. A fifth variable current limiter is connected in series between the fourth variable current limiter and the feedback node and is controlled by the potential at the low-power mode set node. A sixth variable current limiter is connected to the signal node and is controlled by the potential at the low-power mode set node. A seventh variable current limiter is coupled in series between the sixth variable current limiter and the source line and is controlled by the potential on the drain line. A variable pull-up circuit is coupled between the supply of fixed positive potential and the drain line for limiting the potential on the drain line and for controlling the first variable current limiter responsive to the potential on the drain line.

When none of the programmable interconnections is conducting, potential on the drain line is limited to a first positive potential which is less than the fixed positive electrical potential. The first positive potential is sufficient to cause the second and third variable current limiters to conduct, such that potential on the source line is substantially at ground potential and potential at the signal node is substantially at ground potential such that the voltage inverter causes potential at the output node to be at the potential of the supply of fixed electrical potential. The fourth variable current limiter responds to increased potential at the output node by ceasing to conduct, thereby limiting the feedback node potential to a second positive potential, thereby minimizing switching time from a state when none of the programmable interconnections is conducting to a state when at least one of the programmable interconnections is conducting.

When at least one of the programmable interconnections begins to conduct, potential on the drain line falls to a third positive potential insufficient to cause the second and third variable current limiters to conduct, thereby isolating the signal node from the supply of ground electrical potential. The variable pull-up responds to the second positive potential by causing the feedback node potential to decrease from a fourth positive potential to a fifth positive potential, thereby causing the first variable current limiter to conduct, thereby raising the signal node potential. The voltage inverter responds to increase in the signal node potential by lowering the output node to ground potential, the second variable pull-up responding to decrease in the output node potential by latching the signal node to potential of the supply of fixed electrical potential. The fourth variable current limiter begins to conduct only after the output node potential has substantially reached ground potential. The effect of the fourth variable current limiter when conducting is to raise the feedback node potential to a sixth positive potential, limiting maximum possible change in potential on the feedback node, thereby minimizing switching time from state when at least one of the programmable interconnections is conducting to state when none of the programmable interconnections is conducting.

When the low-power node set node potential is high, the fifth variable current limiter ceases to conduct and the sixth variable current limiter conducts, thereby eliminating the effect of the fourth variable current limiter on the feedback node and allowing the seventh variable current limiter to conduct in response to increasing drain line potential caused by a transition from a state when at least one of the programmable interconnections is conducting to state when none of the programmable interconnections is conducting and pull the signal node potential down, thereby minimizing switching time from a state when at least one of the programmable interconnections is conducting to state when none of the programmable interconnections is conducting and providing for low power operation of the sense amplifier.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
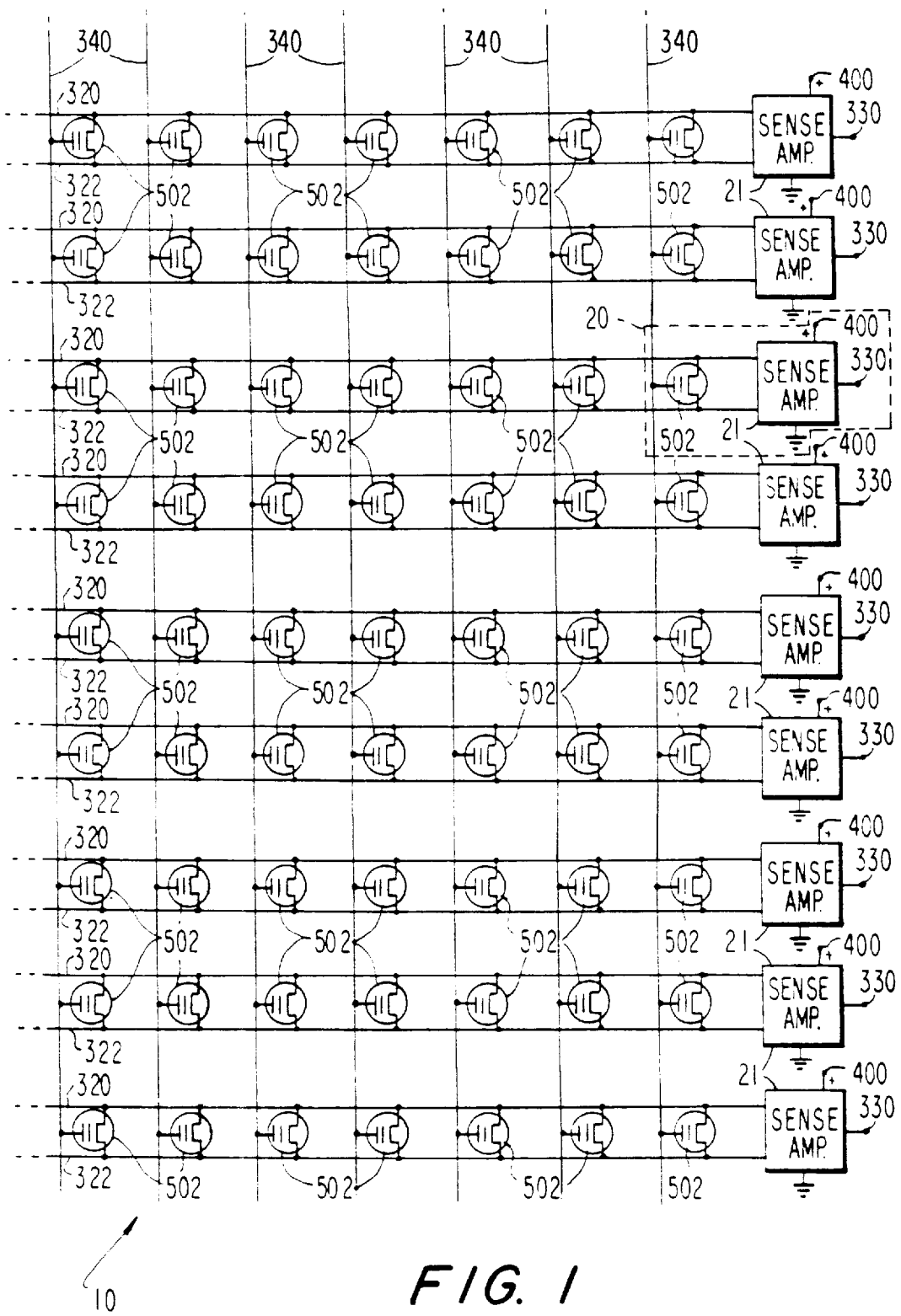
FIG. 1 is a schematic diagram of a portion of a programmable logic device with which the present invention can be used.

The present invention is a sense amplifier circuit, for use with PLDs, that provides improved switching time by actively limiting the voltage swing on the bit line which it is sensing, rather than passively sensing the voltage, and that employs feedback circuits to further improve switching time. Voltage reference control circuitry, comprising variable current limiters controlled by the potential of a supply of reference potential, can be added in series with the feedback circuitry to improve noise immunity. The circuitry of the supply of reference potential is designed so that its sensitivity to fabrication variations is substantially similar to that of the sense amplifier and so that it adjusts the reference potential accordingly.

By limiting the maximum bit line voltage in case of a bit line high (cell OFF) while still providing a high output, and by preventing the bit line voltage from going completely to ground in case of a bit line low (cell ON) while still providing a low output, the present invention decreases the time necessary for the bit line to complete its voltage swing in either direction, whether going to or from a weak zero or a super zero. As a result, this provides a more uniform response time to all bit line voltage changes.

Instead of developing the entire switching potential on the bit line (the common drain electrode of the EPROMs in the preferred embodiment), in the present invention half of the switching potential is developed on the drain line and the other half of the switching potential is developed on the source line. The two smaller potential differences allow quicker charging of the respective capacitances, while the sense amplifier is designed to trip on the sum of the two potential differences.

In the present invention, feedback circuitry is used to minimize the swing in bit line voltage, further reducing the time necessary for the bit line to complete its voltage swing in either direction, whether going to or from a weak zero or a super zero.

Voltage reference control circuitry is placed in series with the feedback circuitry in order to counteract the increased sensitivity to fabrication variations that results from the use of feedback to gain added speed. The voltage reference control circuitry comprises variable current limiters controlled by the potential of a supply of reference potential.

The supply of reference potential is designed so that its sensitivity to fabrication variations is substantially similar to that of the sense amplifier with which it is used, and so that it adjusts the reference potential accordingly.

The present invention also provides for low power operation whereby the power consumption effect of feedback and stabilization circuitry is reduced, albeit at the cost of increased switching time.

The present invention additionally provides for low power operation whereby the power consumption effect of feedback and stabilization circuitry is reduced without significantly affecting switching time.

As set forth above, the consequence of using feedback to gain added speed is a reduction of the sense amplifier circuit's immunity to variations in fabrication of the variable current limiters (typically transistors) used in the sense amplifier. Variable current limiters fabricated with higher device conductivities cause too much feedback, which lowers the immunity of the sense amplifier to device switching noise. Variable current limiters fabricated with lower device conductivities cause too little feedback. The invention decreases the sense amplifier's sensitivity to such fabrication variations by including voltage reference control circuitry which comprises variable current limiters in series with the feedback circuitry. The variable current limiters are controlled by the potential of a supply of reference potential.

The supply of reference potential is designed in a similar manner to the sense amplifier so that if its components and that of the sense amplifier are fabricated with higher conductivities, the potential of the reference supply will be slightly lower, lowering the potential on the gates of the variable current limiters in the stabilization circuitry in series with the feedback circuitry, thereby reducing the current flow in the feedback circuitry and reducing the effect of the feedback. When the components of the supply of reference potential and those of the sense amplifier are fabricated with lower conductivities, the potential of the reference supply will be slightly higher, increasing the potential on the gates of the variable current limiters in the stabilization circuitry in series with the feedback circuitry, thereby increasing the current flow in the feedback circuitry and increasing the effect of the feedback.

Specifically, when the bit line is high, the first preferred embodiment of the present invention holds the maximum bit line voltage to about 1.2 volts, while the second embodiment holds the maximum bit line voltage to about 1.4 volts. These maximum bit line voltages are well below the maximum $V_{cc}$ of about 5 volts and are significantly less than the maximum of about 2 volts that results if no feedback is used. In the case of a worst case downward transition, from high to weak zero, the bit line voltage is held to about 1.1 volts for the first preferred embodiment and to about 1.0 volts for the second preferred embodiment, rather than being allowed to fall to true ground. In the case of a worst case upward transition, from super zero to high, again the voltage swing is from about 1.1 volts for the first preferred embodiment (about 1.0 volts for the second preferred embodiment) to about 1.2 volts for the first preferred embodiment (about 1.4 volts for the second preferred embodiment). Of course, other voltages can be used and a voltage other than zero volts can be used for "ground."

A portion of a programmable logic device 10 with which the present invention can be used is shown in FIG. 1. PLD 10 includes an array of programmable interconnect devices which, as shown, are preferably erasable programmable read-only memory (EPROM) transistors 11. EPROMs 11 are preferably arranged on a substantially orthogonal grid of gate lines 340 and drain lines 320, connected to the respective gate and drain of each EPROM. Parallel to each drain line 320 is a source line 322, connected to the respective source of each EPROM.

In many PLD applications, gate lines 340 are frequently referred to as word lines, while drain lines 320 are frequently referred to as bit lines. Source lines 322 are frequently referred to as ground lines, even where, as here, they are not truly grounded. Although ground lines may run parallel to word lines in some applications, typically PLDs have ground lines which are parallel to the bit lines.

Figure 2:
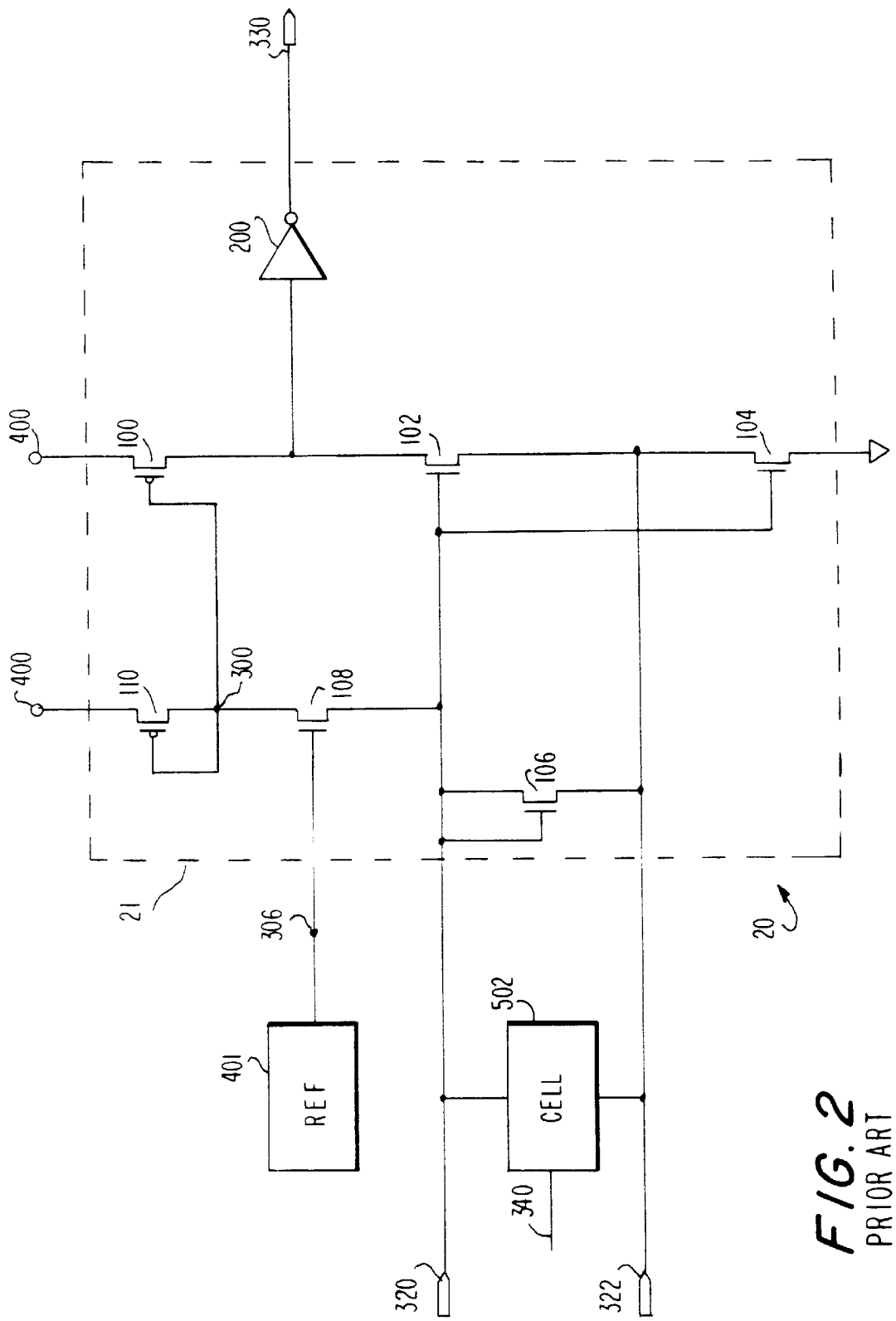
FIG. 2 is an enlarged schematic diagram of a portion of the PLD of FIG. 1 showing a previously known sense amplifier.

In the preferred embodiment of the present invention, each drain line/source line pair 320, 322 is preferably connected to a sense amplifier 21, which in turn is preferably connected to true ground or to some other voltage used as ground, and to a supply 400 of fixed positive potential $V_{cc}$ and which has an output 330. The structures of the various embodiments of the sense amplifier of the present invention are shown in more detail in FIGS. 3, 4, 5, 7 and 9 which are enlarged schematic diagrams of area 20 of FIG. 1. Schematic diagrams of the associated supplies of reference voltage are shown in FIGS. 6 and 8. The structure of a previously known sense amplifier is shown in FIG. 2 for comparison.

Figure 3:
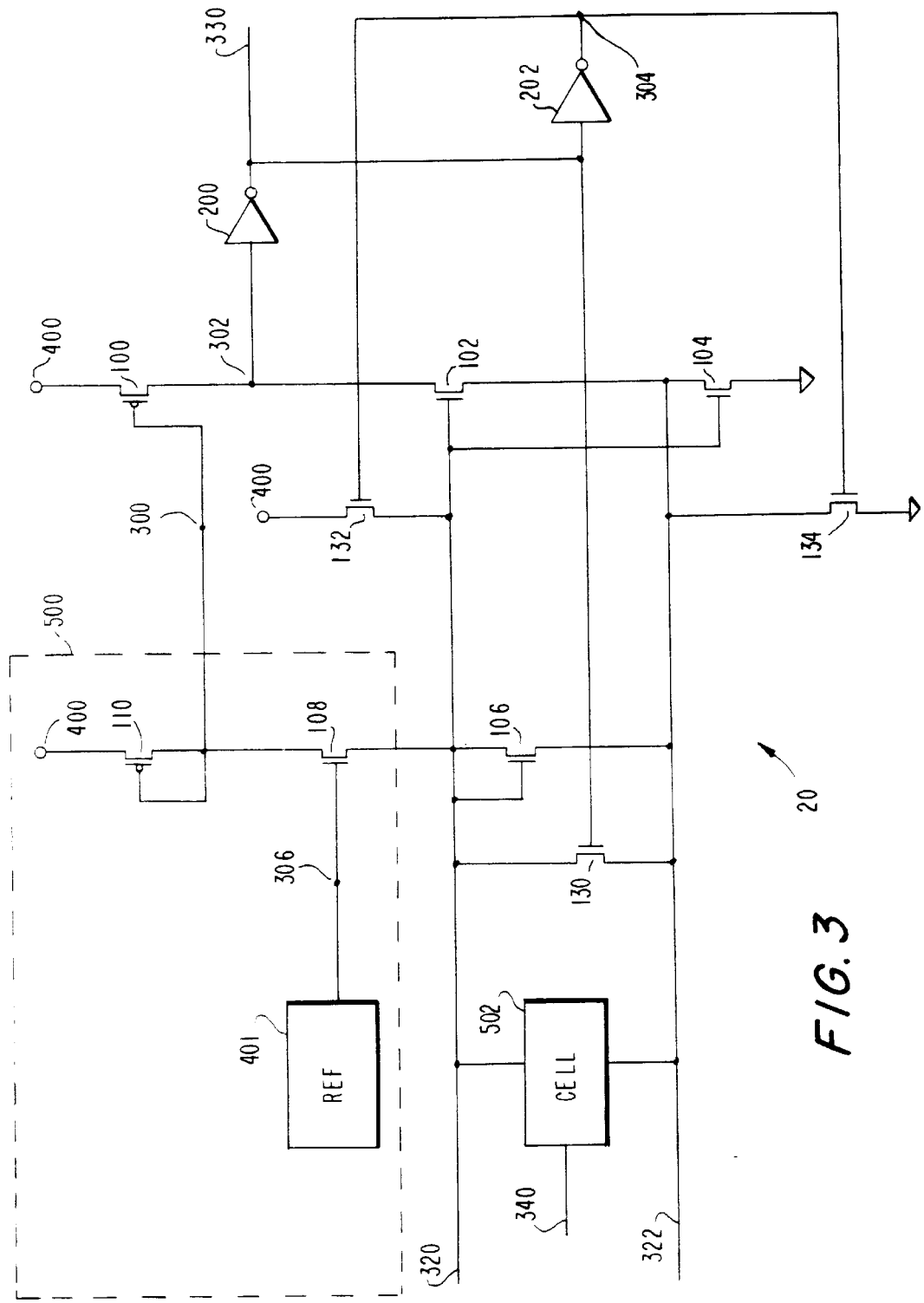
FIG. 3 is a schematic diagram of a portion of the PLD of FIG. 1 showing a preferred embodiment of the sense amplifier of the present invention in which the variable current limiters are field-effect transistors. ("FETs")

In the first preferred embodiment, as shown in FIG. 3, sense amplifier 21 includes eight field effect transistors 100, 102, 104, 108, 110, 130, 132, 134 and two inverters 200, 202. Transistors 102, 104, 108, 130, 132, 134 are preferably n-channel FETs, and transistors 100, 110 are preferably p-channel FETs. Transistors 100, 102, 104, 130, 132, 134 preferably operate in enhancement mode. Transistors 108, 110 preferably operate in enhancement mode, but could also operate in depletion mode.

Transistor 104 has its source connected to ground and its drain connected to source line 322, while its gate is connected to drain line 320. Transistor 102 has its source connected to source line 322, its drain connected to signal node 302, and its gate connected to drain line 320. Transistor 108 has its source connected to drain line 320 and its drain connected to the source and gate of transistor 110, as well as to the gate of transistor 100, and is configured as a cascode, with its gate connected to a reference voltage supply 401 at input node 306. Transistor 110 has its drain connected to its own gate and the gate of transistor 100, as well as to the drain of cascode 108, while its source is connected to supply 400 of fixed positive potential $V_{cc}$. Transistor 100 has its drain connected to signal node 302, its source connected to supply 400 of fixed positive potential $V_{cc}$, and its gate connected to the drain of cascode 108 and to the gate and drain of transistor 110. The node at which the gate of transistor 100, the drain of cascode 108, and the gate and drain of transistor 110 all meet is referred to as the pull-up node 300. Inverter 200 is connected between the signal node 302 and the output node 330. Transistors 130, 132 and 134 are used to provide feedback from the output node 330 to drain line 320 and source line 322. Transistor 130 has its drain connected to drain line 320, its source connected to source line 322, and its gate connected to the output node 330. Inverter 202 is connected between the output node 330 and the feedback node 304. Transistor 132 has its drain connected to supply 400 of fixed positive potential $V_{cc}$, its source connected to drain line 320, and its gate connected to feedback node 304. Transistor 134 has its drain connected to source line 322, its source connected to ground, and its gate connected to feedback node 304.

Preferably, sense amplifier 21 also includes transistor 106 which has its drain and gate connected to drain line 320, and its source connected to source line 322. Transistor 106 helps to prevent the potential difference between drain line 320 and source line 322 from separating more than about 1 volt by conducting more as the difference increases. Under normal operating conditions the potential difference between drain 320 and source 322 remains greater than 1 volt and transistor 106 conducts when cell 502 is OFF.

Preferably, $V_{cc}$ supply 400 is at about 5 volts and reference supply 401 is at about 2 volts.

Sense amplifier 21 of FIG. 3 preferably operates as follows:

When no EPROMs are conducting (i.e., no gate line 340 of any unprogrammed EPROM is high, cell 502 is OFF), drain line 320 is high, being pulled up by $V_{cc}$ through transistor 110, which, in its source-to-gate configuration, is always conducting, and cascode 108. Cascode 108 conducts less as drain line 320 potential rises. A potential of about 1.2 volts on drain line 320 causes the gate-to-source voltages of transistors 102, 104 to rise, causing transistors 102, 104 to conduct, reducing the drain-to-source potential drop of transistors 102, 104, thereby bringing signal node 302 low to about 0.75 volts. Signal node 302 remains isolated from $V_{cc}$ because pull-up node 300 is high, keeping transistor 100 turned off and non-conducting. Inverter 200 brings output node 330 high, as desired for bit line high. Transistor 130 responds to the high output node 330 potential by conducting, thereby causing the potential difference between the drain line 320 (at about 1.2 volts) and the source line 322 (at about 0.2 volts) to be smaller than it would otherwise be. By keeping the potential difference between drain line 320 and source line 322 small when cell 502 is OFF, the feedback provided by transistor 130 allows the sense amplifier 21 to make a rapid transition to cell 502 ON in a weak zero state.

With sense amplifier 21 of FIG. 3 in this state, as EPROMs along drain line 320 begin to conduct, the potential on drain line 320 will begin to drop as drain line 320 is discharged through the conducting EPROMs toward the potential of source line 322. At the same time, the potential on source line 322 will begin to rise as source line 322 is charged through the conducting EPROMs toward the potential of drain line 320. As the first EPROM begins to conduct, because it is the only unprogrammed EPROM in the row to whose gate line 340 a positive potential (at least about 3 volts in the preferred embodiment) is applied, the circuit enters the "weak zero" case.

As EPROM 502 tries to short drain line 320 to source line 322 in the weak zero case, drain line 320 begins to drop relatively slowly from about 1.2 volts towards about 0.95 volt as the capacitance of all of the non-conducting EPROMs is discharged. When the potential difference between drain line 320 and source line 322 drops to less than a first enhancement threshold voltage (about 0.8 volt in the preferred embodiment), transistor 102 turns off, isolating signal node 302 from ground. At the same time, cascode 108 begins to conduct more as its gate-to-source voltage rises. As a result, there are four impedances in series between $V_{cc}$ and ground—viz., transistors 108 and 110, EPROM 502 and transistor 104—forming a voltage divider that begins to pull down the voltage of pull-up node 300. The actual rate and magnitude of the voltage divider effect are determined by the sizes of the various devices in the circuit, which are chosen to provide the desired result. When pull-up node 300 has been pulled down sufficiently to turn transistor 100 on, transistor 100 immediately pulls signal node 302 high. Inverter 200 responds to the high signal node 302 by causing output node 330 to drop to ground. Thus, a rapid response to a weak transition is achieved.

Transistor 130 responds to the decrease in output node potential by ceasing to conduct, thereby isolating drain line 320 from source line. Inverter 202 responds to the decrease in output node 330 potential by causing potential on feedback node 304 to rise to $V_{cc}$. However, because of the delay introduced by inverter 202, the potential on the feedback node 304 is sufficient to cause transistors 132, 134 to conduct only after output node 330 potential has substantially reached ground potential. Transistor 132 begins to conduct, decreasing its drain-to-source potential and thereby raising drain line 320 potential to about 1.1 volt. Transistor 134 begins to conduct and, having been fabricated with a higher device impedance than transistor 104, causes source line 322 potential to be about 0.3 volt, rather than the 0.2 volt value when transistor 104 is conducting. Maximum possible change in potential on drain line 320 and source line 322 is therefore limited. Thus, the sense amplifier 21 is prepared by the feedback of transistors 132, 134 for a rapid transition to a state when none of the EPROMs are conducting.

In a transition from high to "super zero," in which a relatively large number of EPROMs 502 on drain line 320 begin to conduct (because they are not programmed and a positive potential—again preferably at least about 3 volts—has been applied to their respective gate lines 340), sense amplifier 21 will respond similarly to its response in the weak zero case, with the potential on drain line 320 tending to discharge to the potential of source line 322, leading to low potential at signal node 302 and high potential at output node 330, as above. However, because there are more conductances in parallel between drain and source lines 320, 322 in the super zero case, the capacitive discharge tends to be faster and tends to pull the potential of drain line 320 lower. Such a result is undesirable because it would cause an unacceptably long charge-up time in a transition back to the drain line 320 high state. Therefore, in accordance with the present invention, the potential on drain line 320 is prevented from falling too low by the feedback effect of transistor 104, combined with the above-described feedback effects of transistors 132, 134. Because transistor 104 is gated by drain line 320, if the potential on drain line 320 falls too low, the conductance of transistor 104 is substantially reduced, resulting in a relatively small conductance between source line 322 and ground, so that the source line 322 potential rises significantly. The relatively large conductance between drain line 320 and source line 322 compared to the relatively small conductance between source line 322 and ground causes the potentials on drain line 320 and source line 322 to tend toward each other. Because of the present invention, therefore, the potential on drain line 320 does not fall all the way to ground, or even as close to ground as in a conventional device, and the response of sense amplifier 21 when drain line 320 makes the transition back to high is faster, both because drain line 320 is starting from a higher potential and because drain line 320 need not rise so far to reach the maximum potential allowed by the present invention (about 1.2 volts).

In a transition from a state when at least one EPROM is conducting to a state when no EPROM is conducting, drain line 320 potential rises from its steady state cell 502 ON value of about 1.1 volts to a peak of about 1.3 volts, at which point output node 330 potential has risen enough to cause transistor 130 to begin to conduct. By conducting, transistor 130 causes the potential on drain line 320 to decrease from its peak of about 1.3 volts to a steady state cell 502 OFF value of about 1.2 volts, closer to the steady state ON value of about 1.1 volts.

While the potential developed on drain line 320 varies (going as high as about 1.3 volts during transition from the low state to the high state and going as low as about 0.95 volts during the transition from high state to low state), the difference in drain line potential between steady state high (about 1.2 volts) and steady state low (about 1.1 volts) is considerably smaller. One can see that the potential on drain line 320 is always higher in either a weak zero or super zero case (i.e., cell 502 ON) than it is in traditional circuits, while that potential is lower in the high state (i.e., cell 502 OFF) than it is in traditional circuits, with the overall potential swing between the two cases being reduced, in turn reducing the switching time of sense amplifier 21 as compared to previously known sense amplifiers.

As explained above, feedback transistors 130, 132, 134 decrease sense amplifier 21 switching time by reducing the overall drain line 320 potential swing between the high and low states. Feedback transistors 132, 134 conduct when cell 502 is ON. Transistor 132 pulls drain line 320 potential higher, while transistor 134 pulls source line 322 potential lower. Thus the combined effect of transistors 132, 134, when conducting, is to pull the potentials of drain 320 and source 322 lines apart, closer to the trip voltage at which sense amplifier 21 indicates cell 502 is OFF by causing output 330 to go high. Similarly, feedback transistor 130 conducts when cell 502 is OFF. Transistor 130 pulls drain 320 and source 322 line potentials closer together, making the difference between drain 320 and source 322 line voltage decrease toward the trip voltage at which sense amplifier 21 indicates cell 502 is ON by causing output 330 to go low.

However, this decrease in drain line 320 potential swing results in increased noise sensitivity (i.e., the likelihood of a false transition of output node 330 potential is increased).

In the preferred embodiment of sense. amplifier 21, transistors 132, 134 are fabricated with lower device impedance than transistor 130, resulting in stronger ON cell 502 feedback than OFF cell 502 feedback. Thus, the likelihood of instability caused by feedback is greater for the ON cell 502 case. For this reason the supply 401 of reference potential is designed to produce a reference voltage that is responsive to fabrication induced variations in device impedance of sense amplifier 21.

Figure 4:
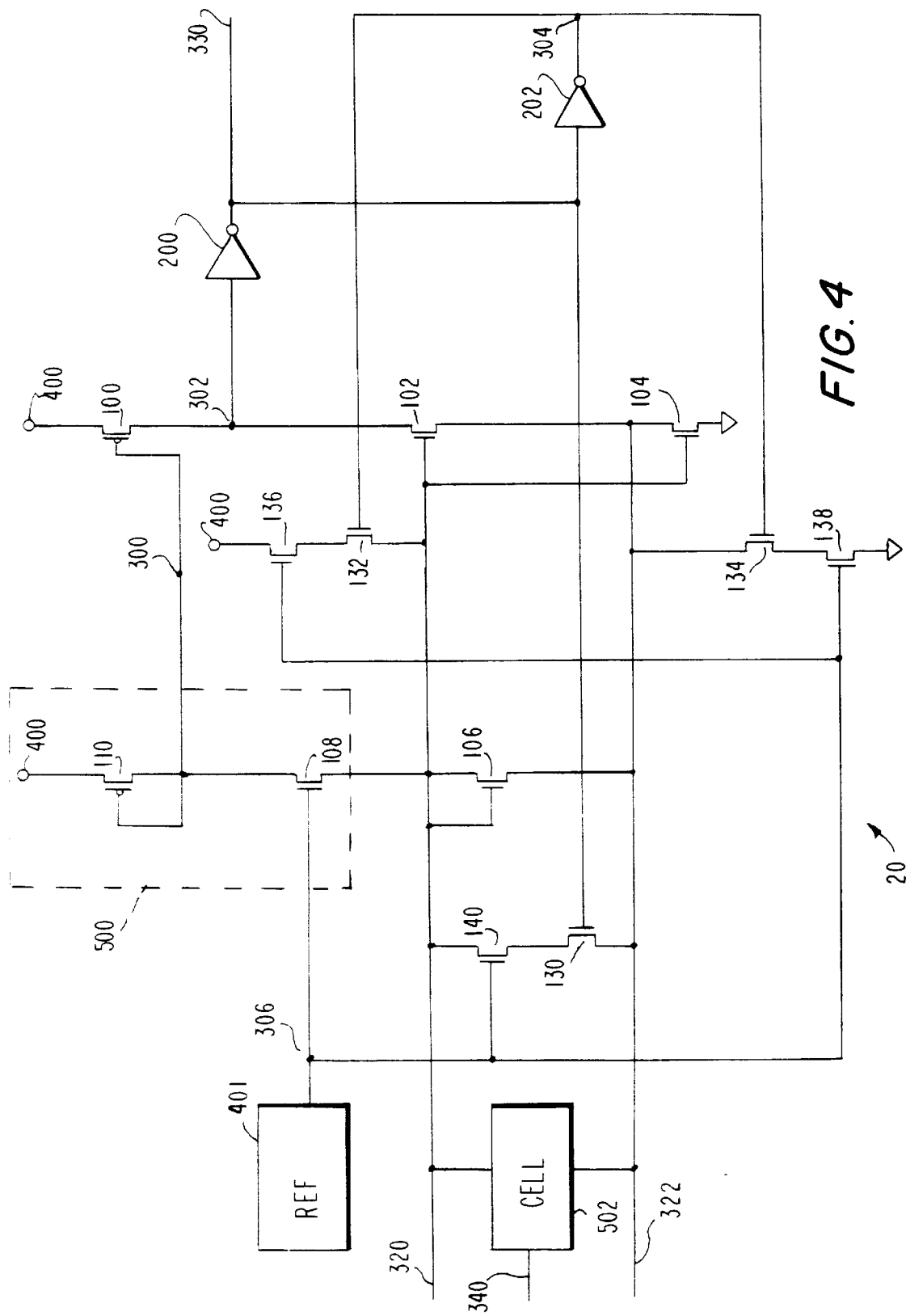
FIG. 4 is a schematic diagram of the sense amplifier of FIG. 3, in which voltage reference control circuitry has been added to the feedback circuitry.

As shown in FIG. 4, the first implementation of sense amplifier 21 preferably also includes voltage reference control circuitry for the feedback transistors 130, 132, 134. Transistor 140 is connected between drain line 320 and transistor 130 and has its drain connected to drain line 320, its source line connected to drain of transistor 130, and its gate connected to reference supply 401 at the input node 306. Transistor 136 is connected between supply 400 of fixed positive potential $V_{cc}$ and transistor 132 and has its drain connected to supply 400 of fixed positive potential $V_{cc}$, its source connected to drain of transistor 132, and its gate connected to reference supply 401 at the input node 306. Transistor 138 is connected between transistor 134 and ground and has its drain connected to source of transistor 134, its source connected to ground, and its gate connected to reference supply 401 at the input node 306.

When fabrication results in n-channel transistors 130, 132, 134 with lower device impedances, the effect of feedback increases (and decreases when fabrication results in lower impedances). As will be explained later (with reference to FIG. 6), the potential of the supply 401 of reference potential varies with the fabrication of the transistors. Specifically, when n-channel-device impedance is low (high), the reference potential decreases (increases). Voltage reference control transistors 136, 138, 140 conduct less (more) as the potential on their gates (i.e., the reference potential) decreases (increases), thereby counteracting the effect of increased (decreased) transistor 130, 132, 134 feedback due to lower (higher) device impedance caused by variations in fabrication.

Voltage reference control transistors 136, 138 also function to insulate source line 322 and drain line 320 from variations in potentials of $V_{cc}$ and ground caused by switching. The voltage reference output level decreases (increases) with lower (higher) n-channel impedance due to process variations in fabrication and thus devices 136 and 138 (ON cell feedback) and device 140 (OFF cell feedback) are reduced (increased) in conduction strength. Upon device output drivers switching high or low, noise is introduced onto the $V_{cc}$ and ground nodes of the device which effects the sense amplifier stability. With the reduced conduction of the feedbacks, the effect of noise on the source line 322 and drain line 320 is also reduced. Noise spikes both negative and positive have been observed to be larger (smaller) when the n-channel device impedance is low (high). Thus when the noise level is worst (low impedance processing), the voltage reference increases the sense amplifier's immunity to noise by lowering its output potential and decreasing the effect of the feedbacks. This not only gives more noise margin in terms of the voltage differences between the drain line and source line, but also reduces the amount of noise able to couple onto those nodes through each feedback.

Conversely, when more device speed is needed and noise level is better (high device impedance) the voltage reference output level increases to provide more feedback effect and, as a result, increased switching speed.

Figure 5:
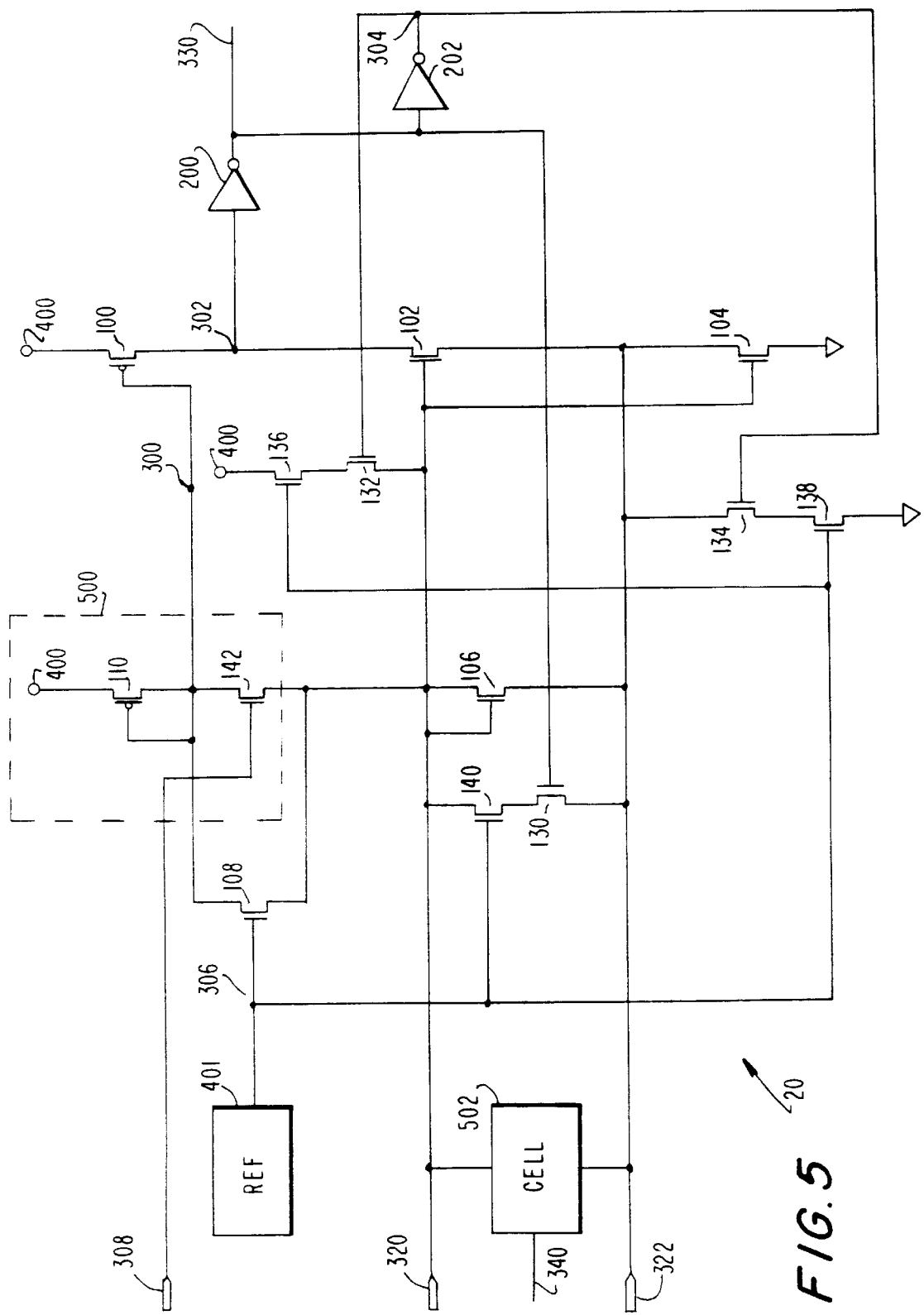
FIG. 5 is a schematic diagram of the sense amplifier of FIG. 4, to which circuitry for a low power option has been added.
Figure 6:
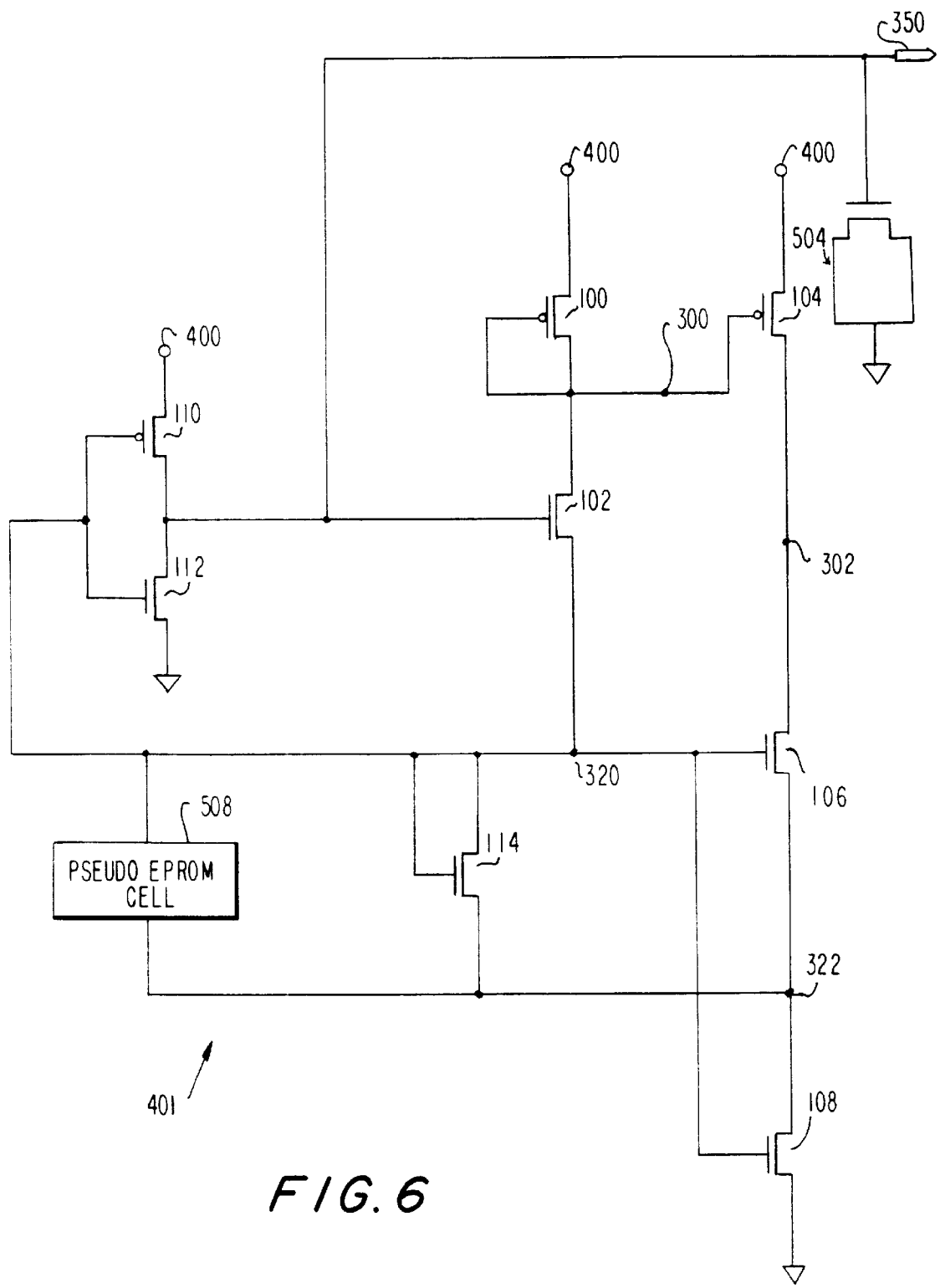
FIG. 6 is a schematic diagram of a preferred embodiment of a supply of reference potential according to the present invention, optimized for use with the sense amplifiers of FIGS. 3–5.

As shown in FIG. 5, the first preferred embodiment preferably also includes circuitry for optional low power operation. Transistor 142 has its drain connected to pull-up node 300, its source connected to drain line 320, and its gate connected to reference supply 401 at input node 308.

For normal operation, input nodes 306, 308 are connected to reference supply 401. During normal operation transistors 108, 142 operate in parallel as if they were a single cascode. For low power operation input node 306 is grounded, while input node 308 is connected to reference supply 401. During low power operation, the gates of transistors 108, 136, 138, 140 are grounded causing transistors 108, 136, 138, 140 to cease conducting, thereby reducing power consumption. However, with transistors 136, 138, 140 not conducting, transistors 130, 132, 134 are prevented from conducting and the effect of feedback is eliminated.

FIG. 6 shows an embodiment of a supply 401 of reference potential of the present invention, optimized for use with the sense amplifiers 21 of FIGS. 3–5. Preferably supply 401 of reference potential includes seven field effect transistors 100, 102, 104, 106, 108, 110, 112, 114. Transistor 104 is preferably a p-channel FET and transistors 106, 108 are preferably n-channel FETs. Transistors 104, 106, 108 preferably operate in enhancement mode. Transistor 100 is preferably a p-channel FET and transistor 102 is preferably an n-channel FET, both preferably operating in enhancement mode, although they could also operate in depletion mode.

Transistor 108 has its source connected to ground and its drain connected to node 322, while its gate is connected to node 320. Transistor 106 has its source connected to node 322, its drain to node 302, and its gate connected to node 320. Transistor 102 has its source connected to node 320, its drain connected to node 300, and its gate connected to output node 350. Transistor 100 has its drain connected to its own gate and the gate of transistor 104, as well as to the drain of transistor 102, while its source is connected to supply 400 of fixed positive potential $V_{cc}$. Transistor 104 has its drain connected to node 302, its source connected to supply 400 of fixed positive potential $V_{cc}$, and its gate connected to the drain of transistor 102 and to the gate and drain of transistor 100. Together transistors 110, 112 form a voltage divider. Transistor 110 has its source connected to supply 400 of fixed positive potential $V_{cc}$, its drain connected to output node 350, and its gate connected to node 320. Transistor 112 has its drain connected to the drain of transistor 110 at output node 350, its source connected to ground, and its gate connected to the gate of transistor 112 at node 320. Transistor 114 has drain and gate tied together at node 320, and its source connected to node 322. Pseudo EPROM cell 508 is fabricated such that its output characteristics are substantially similar to that of an ON cell. Pseudo EPROM cell 508, when present, is connected between nodes 320, 322.

Supply 401 of reference potential preferably also includes stabilizing capacitor 504 connected to output node 350.

Supply 401 of reference potential produces a voltage which is about 2 volts at its output node 350. When fabrication results in lower (higher) transistor device impedance, transistors 106, 108 conduct more (less), voltage at node 320 rises (falls). As node 320 voltage increases (decreases), .transistor 110 conducts less (more) and transistor 112 conducts more (less). Thus, when n-channel device impedance is low (high), the reference potential at output node 350 decreases (increases).

In the preferred implementation of sense amplifier 21 of FIGS. 3–5, transistors 132, 134 are purposely fabricated stronger than transistor 130, resulting in stronger ON cell 502 feedback than OFF cell 502 feedback. Thus, the likelihood of sense amplifier 21 instability caused by feedback is greater for the ON cell 502 case. For this reason the preferred implementation of supply 401 of reference potential is designed to correspond to the preferred embodiment of sense amplifier 21 in the ON case.

When feedback transistor 130 of sense amplifier 21 of FIGS. 3–5 is designed weaker than transistors 132, 134 of sense amplifier 21 of FIGS. 3–5, supply 401 of reference potential includes pseudo EPROM cell 508. Pseudo EPROM cell 508 is fabricated such that its output characteristics are substantially similar to that of an ON cell. When fabrication results in lower (higher) transistor device impedance, pseudo EPROM cell 508 conducts more (less), causing voltage at node 320 to fall (rise).

Figure 7:
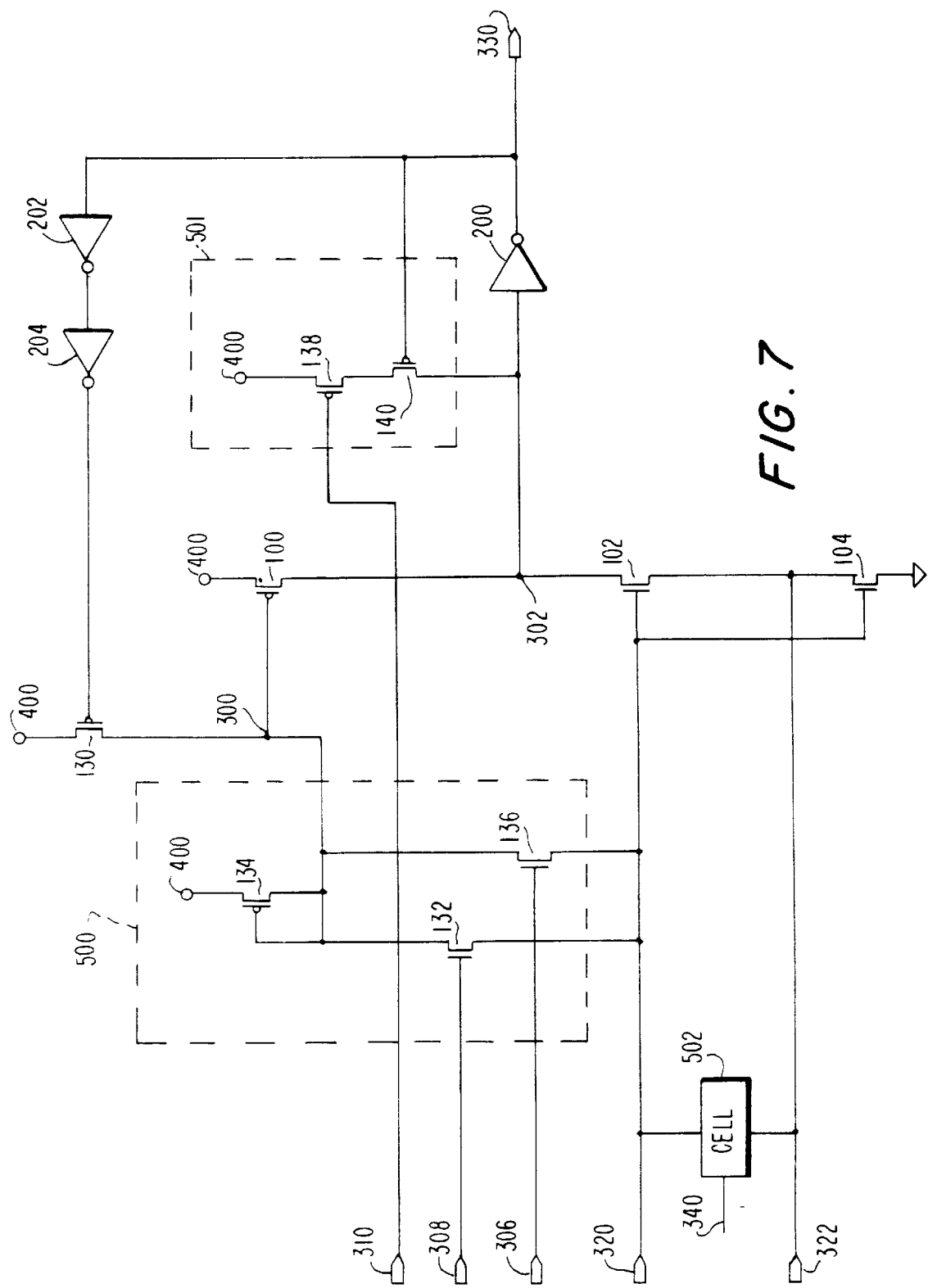
FIG. 7 is a schematic diagram of a second referred embodiment of the sense amplifier of the resent invention.
Figure 8:
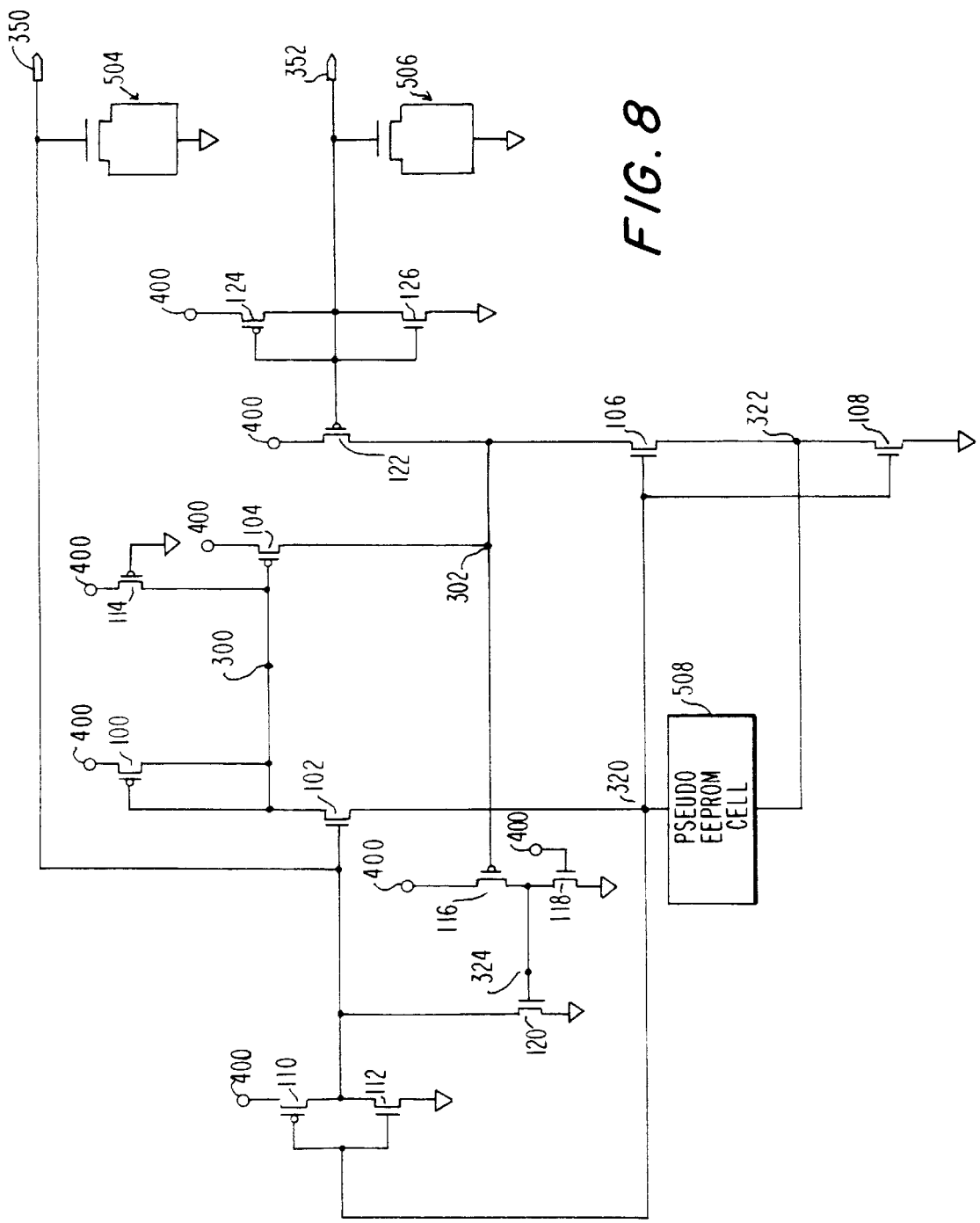
FIG. 8 is a schematic diagram of a preferred embodiment of a supply of reference potential according to the present invention, optimized for use with the sense amplifier of FIG. 7.

In the second preferred embodiment, shown in FIG. 7, sense amplifier 21 includes nine field effect transistors 100, 102, 104, 130, 132, 134, 136, 138, 140 and three inverters 200, 202, 204. Transistors 102, 104, 132, 136 are preferably n-channel FETs, and transistors 100, 130, 134, 138, 140 are preferably p-channel FETs. Transistors 100, 102, 104, 130, 132, 134, 136, 138, 140 preferably operate in enhancement mode, but transistors 132, 134, 136 could also operate in depletion mode.

Transistor 104 has its source connected to ground and its drain connected to source line 322, while its gate is connected to drain line 320. Transistor 102 has its source connected to source line 322, its drain connected to signal node 302, and its gate connected to drain line 320. Together transistors 132, 134, 136 form a pull-up. Transistor 136 has its source connected to drain line 320 and its drain connected to the source and gate of transistor 134, as well as to the gate of transistor 100, and is configured as a cascode, with its gate connected to input node 306. Transistor 132 has its source connected to drain line 320 and its drain connected to the source and gate of transistor 134 as well as to the gate of transistor 100, and is configured as a cascode, with its gate connected to input node 308. Transistor 134 has its drain connected to its own gate and the gate of transistor 100, as well as to the drain of cascodes 132, 136, while its source is connected to supply 400 of fixed positive potential $V_{cc}$. Transistor 100 has its drain connected to signal node 302, its source connected to supply 400 of fixed positive potential $V_{cc}$, and its gate connected to the drain of cascodes 132, 136 and to the gate and drain of transistor 134. The node at which the gate of transistor 100, the drains of cascodes 132, 136, and the gate and drain of transistor 134 all meet is referred to as the feedback node 300. Inverter 200 is connected between the signal node 302 and the output 330. Transistor 130 and inverters 202, 204 are used to provide feedback from the output node 330 to feedback node 300 when cell 502 is ON. Transistor 130 has its source connected to supply 400 of fixed positive potential $V_{cc}$, its drain connected to feedback node 300. Output node 330 is connected to the gate of transistor 130 through the series combination of inverters 202, 204. Together transistors 138, 140 form a pull-up. Transistor 138 has its source connected to supply 400 of fixed positive potential, its drain connected to the source of transistor 140, and its gate connected to input node 310. Transistor 140 has its source connected to the drain of transistor 138, its drain connected to signal node 302, and its gate connected to output node 330.

Like the first preferred embodiment of sense amplifier 21, as shown in FIG. 5, the second preferred embodiment of sense amplifier 21, as shown in FIG. 7, can operate in both normal and low power modes. Input node 306 of FIG. 7 is connected to output node 350 (which is at about 2 volts) of supply 401 of reference potential of FIG. 8. For normal operation, input node 308 is connected to output node 350 (which is at about 2 volts) of supply 401 of reference potential. For low power operation input node 308 is connected to ground, thereby causing transistor 132 to cease conducting. Input node 310 of sense amplifier 21 of FIG. 7 is connected to output node 352 (which is at about 4 volts) of supply 401 of reference potential of FIG. 8. The transistor pair 138, 140 latches signal node 302 high when the cell 502 is ON. When output node 330 is low (corresponding to cell 502 ON), the gate of transistor 140 is also low, and transistor 140 conducts, thereby latching signal node 302 high.

In contrast to the first preferred embodiment of sense amplifier 21 of FIG. 5, the second preferred embodiment of sense amplifier 21 of FIG. 7 has only one feedback path (through transistors 130, 132, 136) from output node 330 to drain line 320. Without feedback through transistor 130 to pull up feedback node 300 voltage, feedback node 300 voltage would decrease from about 4.5 volts (corresponding to cell 502 OFF) to below about 2.3 volts when cell 502 is ON. Since feedback node 300 voltage couples through transistors 132, 136 to drain line 320, reducing the swing in feedback node 300 voltage helps to reduce the overall potential swing of drain line 320 voltage between when the cell 502 is ON and cell 502 is OFF, in turn reducing the switching time of sense amplifier 21 as compared to previously known sense amplifiers. Transistor 130 gate voltage decreases, causing transistor 130 to conduct, when output node 330 voltage decreases (corresponding to cell 502 ON) but only after a delay (caused by inverters 202, 204). When transistor 130 begins to conduct, drain-to-source potential drop decreases, thereby pulling feedback node 300 voltage higher from a low of about 2.3 volts to a steady state cell 502 ON value of about 3.8 volts. For normal operation, gates of transistors 132, 136 are connected to output node 350 (at about 2 volts) of supply 401 of reference potential of FIG. 8. As will be explained in reference to FIG. 8, potential of output node 350 of supply 401 of reference potential decreases (increases) slightly when fabrication variations result in devices having lower (higher) impedance, thereby lowering (raising) the potential on the gates of transistors 132, 136, causing them to conduct less (more) and resulting in less (more) feedback from transistor 130 being passed through to drain line 320.

Shown in FIG. 8 is an embodiment of a supply 401 of reference potential of the present invention, optimized for use with the sense amplifier 21 of FIG. 7. Preferably supply 401 of reference potential includes fourteen field effect transistors 100, 102, 104, 106, 108, 110, 112, 114, 116, 118, 120, 122, 124, 126 and a pseudo EPROM cell 508 for simulating the output characteristics of an EPROM cell in the ON state. Transistors 100, 104, 110, 114, 116, 122, 124 are preferably p-channel FETs and transistors 102, 106, 108, 112, 118, 120, 126 are preferably n-channel FETs. Transistors 104, 106, 108, 110, 112, 114, 116, 118, 120, 122, 124, 126 preferably operate in enhancement mode. Transistors 100, 102 preferably operate in enhancement mode but could also operate in depletion mode.

Transistor 108 has its source connected to ground and its drain connected to node 322, while its gate is connected to node 320. Transistor 106 has its source connected to node 322, its drain to node 302, and its gate connected to node 320. Transistor 104 has its source connected to supply 400 of fixed positive potential 400, its drain connected to node 302, and its gate connected to node 300. Transistor 100 has its drain connected to its own gate and the gate of transistor 104, as well as to the drain of transistor 102, while its source is connected to supply 400 of fixed positive potential $V_{cc}$. Transistor 102 has its drain connected to node 300, its source connected to node 320, and its gate connected to output node 350. Together transistors 110, 112 form a voltage divider. Transistor 110 has its source connected to supply 400 of fixed positive potential $V_{cc}$, its drain connected to output node 350, and its gate connected to node 320. Transistor 112 has its drain connected to the drain of transistor 110 at output node 350, its source connected to ground, and its gate connected to the gate of transistor 110 at node 320. Pseudo EPROM cell 508 is connected between nodes 320, 322. Transistor 114 has its source connected to supply 400 of fixed positive potential, its drain connected to node 300, and its gate connected to ground. Together transistors 116, 118, 120 form a feedback circuit from node 302 to output node 350. Transistor 116 has its source connected to supply 400 of fixed positive potential, its drain connected to reference feedback node 324, and its gate connected to node 302. Transistor 118 has its drain connected to the drain of transistor 116 at reference feedback node 324, its source connected to ground, and its gate connected to supply 400 of fixed positive potential. Transistor 120 has its drain connected to output node 350, its source connected to ground, and its gate connected to reference feedback node 324. Transistor 122 has its source connected to supply 400 of fixed positive potential, its drain connected to node 302, and its gate connected to output node 352. Together transistors 124, 126 form a voltage divider. Transistor 124 has its source connected to supply 400 of fixed positive potential $V_{cc}$, its drain and gate connected to output node 352. Transistor 126 has its drain connected to the drain of transistor 124 at output node 352, its source connected to ground, and its gate connected to the gates of transistor 122, 124 at output node 352.

Supply 401 of reference potential preferably also includes stabilizing capacitor 504 (which may be constructed by tying the gate of an n-channel FET operating in enhancement or depletion mode to output node 350, and connecting its drain and source to ground) connected to output node 350, and stabilizing capacitor 506 (which may be fabricated in a similar manner as capacitor 504) connected between output node 352 and ground.

Supply 401 of reference potential produces a voltage which is about 2 volts at output node 350. At output node 352 supply 401 produces a voltage of about 4 volts. As shown, feedback through transistor 130 of FIG. 7 is present only when cell 502 is ON. Therefore, the danger of instability due to excessive feedback is present only when cell 502 is ON. Therefore, supply 401 of reference potential of FIG. 8 is designed to simulate the structure of sense amplifier 21 of FIG. 7 when cell 502 is ON. Pseudo EPROM cell 508 is fabricated such that its output characteristics are substantially similar to that of an ON cell. When the transistors are fabricated so that device impedance is lower (higher), pseudo EPROM cell 508 conducts more (less), causing voltage at node 320 to fall (rise). As node 320 voltage increases (decreases) transistor 110 conducts less (more) and transistor 112 conducts more (less). Thus, when n-channel device impedance is low (high), the reference potential at output node 350 decreases (increases) slightly. Node 302 voltage decreases when transistors 104, 122 are fabricated so that the device impedances are higher. Lower node 302 voltage causes transistor 116 to conduct more, which causes potential at reference feedback node 324 to rise, which causes transistor 120 to conduct more, which pulls down potential on output node 350. Transistor 114 (which corresponds to transistor 130 in FIG. 7 in the cell 502 ON state) is always conducting because its gate is connected to ground. With transistor 130 conducting, node 300 voltage is maintained at about 3.8 volts. When transistor 114 (which corresponds to transistor 130 in FIG. 7) is fabricated with lower (higher) device impedance, node 300 voltage is caused to increase (decrease) slightly. This increase (decrease) in node 300 voltage causes node 320 voltage to increase (decrease) because of coupling through transistor 102.

Figure 9:
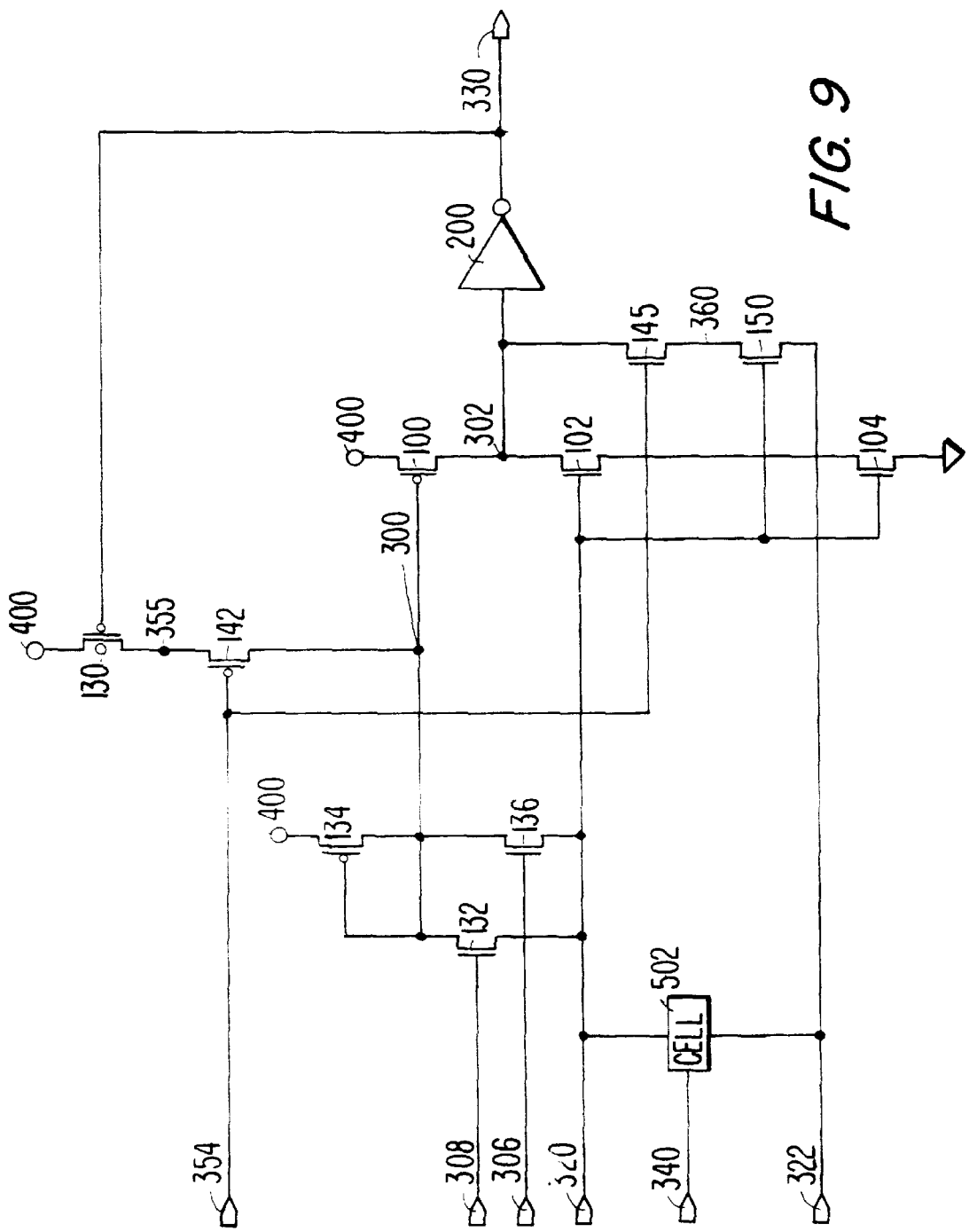
FIG. 9 is a schematic diagram of a third preferred embodiment of the sense amplifier of the present invention.

In the third preferred embodiment, shown in FIG. 9, sense amplifier includes ten field effect transistors 100, 102, 104, 130, 132, 134, 136, 142, 145, 150 and one inverter 200. Transistors 102, 104, 132, 136, 145, 150 are preferably n-channel FETs with ON threshold voltages ($V_T$) of about 0.7 volt, and transistors 100, 130, 134, 142 are preferably p-channel FETs with ON threshold voltages ($V_T$) of about −0.7 volt. Transistors 100, 102, 104, 130, 132, 134, 136, 142, 145, 150 preferably operate in enhancement mode, but transistors 134, 136 could also operate in depletion mode. Transistor 150 is a native device with a low ON threshold voltage (VT) of about 0.3 volt.

Transistor 104 has its source connected to ground and its drain connected to source line 322, while its gate is connected to drain line 320. Transistor 102 has its source connected to source line 322, its drain connected to signal node 302, and its gate connected to drain line 320. Together transistors 132, 134, 136 form a pull-up. Transistor 136 has its source connected to drain line 320 and its drain connected to the source and gate of transistor 134, as well as to the gate of transistor 100, and is configured as a cascode, with its gate connected to input node 306. Transistor 132 has its source connected to drain line 320 and its drain connected to the source and gate of transistor 134 as well as to the gate of transistor 100, and is configured as a cascode, with its gate connected to input node 308. Transistor 134 has its drain connected to its own gate and the gate of transistor 100, as well as to the drain of cascodes 132, 136, while its source is connected to supply 400 of fixed positive potential $V_{cc}$. Transistor 100 has its drain connected to signal node 302, its source connected to supply 400 of fixed positive potential $V_{cc}$, and its gate connected to the drains of cascodes 132, 136 and to the gate and drain of transistor 134. The node at which the gate of transistor 100, the drains of cascodes 132, 136, and the gate and drain of transistor 134 all meet is referred to as the feedback node 300. Inverter 200 is connected between the signal node 302 and the output node 330. Transistors 130, 142 are used to provide feedback from the output node 330 to feedback node 300 when cell 502 is ON. Transistor 130 has its source connected to supply 400 of fixed positive potential $V_{cc}$, its gate connected to output node 330 and its drain connected to the source of transistor 142. Transistor 142 has its source connected to the drain of transistor 130, its drain connected to feedback node 300 and its gate connected to input node 354. Transistor 145 has its drain connected to signal node 302 and its gate connected to input node 354. Transistor 150 has its drain connected to the source of transistor 145, its source connected to source line 322 and its gate connected to drain line 320.

Like the first and second preferred embodiments of sense amplifier 21, as shown in FIGS. 5 and 7, the third preferred embodiment of sense amplifier 21, as shown in FIG. 9, can operate in both normal and low power modes. Input node 306 of FIG. 9 is connected to a supply of reference potential (which is at about 2.2 volts in the preferred embodiment). It should be noted that input node 306 could be grounded in high power mode with little effect on the sense amplifier performance. For normal operation, input node 308 is connected to a supply of reference potential (which is at about 2.5 volts in the preferred embodiment). For low power operation, node 308 is grounded. For normal operation, input node 354 is connected to ground. The voltage reference levels and the gate widths of transistors 132 and 136 are individually optimized for the desired high power to low power ratio.

For low power operation of the third embodiment, input node 308 is connected to ground, thereby causing transistor 132 to cease conducting. During low power operation input node 354 is connected to supply 400 of fixed positive potential $V_{cc}$, causing transistor 142 to cease conducting and thereby disabling the feedback path through transistor 130. In low power mode, the switching time of sense amplifier in response to an ON to OFF transition of cell 502 is considerably slower than in response to an OFF to ON transition of cell 502. When cell 502 is ON, signal node 302 voltage is close to $V_{cc}$, transistor 145 is ON, the voltage difference between drain line 320 and source line 322 voltage is only about 0.2 volt, transistors 102, 150 are in parallel and OFF. When cell 502 turns OFF, the voltage of drain line 320 does not have to rise very far to turn transistor 150 ON. Turning transistor 150 ON helps to pull the voltage of signal node 302 down sooner than if just transistor 102 were used, thereby allowing for faster ON to OFF low power mode switching times without increased power.

In contrast to the first preferred embodiment of sense amplifier of FIG. 5, the third preferred embodiment of sense amplifier of FIG. 9 has only one feedback path (through transistors 130, 132, 136) from output node 330 to drain line 320. Without feedback through transistor 130 to pull up feedback node 300 voltage, feedback node 300 voltage would decrease from about 4.5 volts (corresponding to cell 502 OFF) to below about 2.3 volts when cell 502 is ON. Since feedback node 300 voltage couples through transistors 132, 136 to drain line 320, reducing the swing in feedback node 300 voltage helps to reduce the overall potential swing of drain line 320 voltage between when the cell 502 is ON and cell 502 is OFF, in turn reducing the switching time of sense amplifier as compared to previously known sense amplifiers. Transistor 130 gate voltage decreases, causing transistor 130 to conduct, when output node 330 voltage decreases (corresponding to cell 502 ON). When transistor 130 begins to conduct feedback node 300 voltage is pulled higher from a low of about 2.3 volts to a steady state cell 502 ON value of about 3.8 volts. As a result, drain line 320 voltage and source line 322 voltage are pulled apart, preconditioning drain line 320 and source line 322 for an ON to OFF transition. Input node 306 of FIG. 9 is connected to a supply of reference potential (which is at about 2.2 volts in the preferred embodiment). For normal operation, input node 308 is connected to a supply of reference potential (which is at about 2.5 volts in the preferred embodiment). For normal operation, input node 354 is connected to ground.

In contrast to the second preferred embodiment of sense amplifier 21, as shown in FIG. 7, the third preferred embodiment, as shown in FIG. 9, does not require transistor pair 138, 140. Because transistor 142 is OFF during low power operation, feedback through transistor 130 is disabled. Node 300 is pulled down to about 3.2 volts when the cell is ON which means that transistor 100 can be strongly ON and the need to pull up signal node 302 voltage with additional circuitry (for example, transistors 138 and 140 in the second embodiment shown FIG. 7) is eliminated. In addition to requiring fewer transistors, the third preferred embodiment achieves a performance increase because, unlike in the second embodiment of FIG. 7, it is not necessary to wait for signal node 302 voltage to drop while transistor 140 turns OFF during the transition from cell 502 ON to cell 502 OFF.

Another difference between the embodiments of sense amplifier shown in FIGS. 7 and 9 is that FIG. 9 does not employ inverters 202, 204 to delay the start of transistor 130 conduction. It should be noted that the use of inverters 202, 204 is optional and, for this reason, they are not shown in the sense amplifier of FIG. 9.

The supplies of reference potential for use with the third preferred embodiment may be designed in accordance with the principles of the supplies of reference potential used in the first and second embodiments. Reference potentials can be tuned to optimal values by selecting appropriate ratios of gate widths of transistors 110, 112 (see FIG. 8, for example), thereby providing optimal performance in both high and low power modes.

Thus it is seen that a sense amplifier having switching times that are substantially the same regardless of the initial state, with which the voltage swing on the bit line of a PLD is limited to improve switching speed by means of feedback, with which voltage reference control counteracts effects of variations in fabrication, and having provision for low power operation as well as normal operation, is provided. One skilled in the art will appreciate that the present invention can be practiced by other than the described embodiments, which are presented for purposes of illustration and not of limitation, and the present invention is limited only by the claims which follow.

What is claimed is:

1. A memory comprising:

a memory cell;

a first node coupled to the memory cell, the first node configured to move, depending on the state of the memory cell, to either a first voltage or a second voltage when the memory cell is accessed, and to the first voltage when the memory cell is not accessed;

a second node coupled to the first node, the second node configured to assume, depending on the state of the memory cell, either a first state or a second state when the memory cell is accessed, and configured to assume the first state when the memory cell is not accessed; and a recovery circuit configured to reset the second node from the second state to the first state when the second node assumes the second state after the memory cell is accessed the recovery circuit including:

a first transition element configured to transition the second node from the second state to the first state when the first node moves to a first intermediate voltage between the first voltage and the second voltage; and a second transition element configured to transition the second node from the second state to the first state when the first node moves to a second intermediate voltage between the first voltage and the second voltage, wherein the second transition element is configured to be activated prior to the activation of the first transition element.

2. A memory comprising:

a memory cell;

a first node coupled to the memory cell, the first node configured to move, depending on the state of the memory cell, to either a first voltage or a second voltage when the memory cell is accessed, and to the first voltage when the memory cell is not accessed;

a second node coupled to the first node, the second node configured to assume, depending on the state of the memory cell, either a first state or a second state when the memory cell is accessed, and configured to assume the first state when the memory cell is not accessed; and a recovery circuit configured to reset the second node from the second state to the first state when the second node assumes the second state after the memory cell is accessed, the recovery circuit including:

a first transition element configured to transition the second node from the second state to the first state when the first node moves to a first intermediate voltage between the first voltage and the second voltage:

a second transition element configured to transition the second node from the second state to the first state when the first node moves to a second intermediate voltage between the first voltage and the second voltage; and a third transition element configured to selectively disable the second transition element during high power mode operation.

3. A memory comprising:

a memory cell;

a first node coupled to the memory cell, the first node configured to move, depending on the state of the memory cell, to either a first voltage or a second voltage when the memory cell is accessed, and to the first voltage when the memory cell is not accessed;

a second node coupled to the first node, the second node configured to assume, depending on the state of the memory cell, either a first state or a second state when the memory cell is accessed, and configured to assume the first state when the memory cell is not accessed; and a recovery circuit configured to reset the second node from the second state to the first state when the second node assumes the second state after the memory cell is accessed, the recovery circuit including:

a first transition element configured to transition the second node from the second state to the first state when the first node moves to a first intermediate voltage between the first voltage and the second voltage; and a second transition element configured to transition the second node from the second state to the first state when the first node moves to a second intermediate voltage between the first voltage and the second voltage.

4. The memory of claim 3 further comprising a fifth transition element configured to selectively couple the second node to a source of potential.

5. A memory comprising:

a memory cell;

a first node coupled to the memory cell, the first node configured to move, depending on the state of the memory cell, to either a first voltage or a second voltage when the memory cell is accessed, and to the first voltage when the memory cell is not accessed;

a second node coupled to the first node, the second node configured to assume, depending on the state of the memory cell, either a first state or a second state when the memory cell is accessed, and configured to assume the first state when the memory cell is not accessed; and a recovery circuit configured to reset the second node from the second state to the first state when the second node assumes the second state after the memory cell is accessed. the recovery circuit including:

a first transition element configured to transition the second node from the second state to the first state when the first node moves to a first intermediate voltage between the first voltage and the second voltage:

a second transition element configured to transition the second node from the second state to the first state when the first node moves to a second intermediate voltage between the first voltage and the second voltage; and a fourth transition element configured to cooperate with the first transition element to transition the second node from the second state to the first state when the first node moves to a first intermediate voltage between the first voltage and the second voltage.

6. The memory of claim 5, wherein the fourth transition element is controlled by the potential on the first node.

7. The memory of claim 5 further comprising an inverter element coupled between the second node and an output node.

8. The memory of claim 7 further comprising a seventh transition element configured to selectively disable a sixth transition element during low power operation.

9. The memory element of claim 7 further comprising an eighth transition element controlled by the voltage at a third node and configured to selectively couple a fifth node to a source of potential.

10. A memory comprising:

a memory cell;

a first node coupled to the memory cell, the first node configured to move, depending on the state of the memory cell, to either a first voltage or a second voltage when the memory cell is accessed, and to the first voltage when the memory cell is not accessed;

a second node coupled to the first node, the second node configured to assume, depending on the state of the memory cell, either a first state or a second state when the memory cell is accessed, and configured to assume the first state when the memory cell is not accessed; and a recovery circuit configured to reset the second node from the second state to the first state when the second node assumes the second state after the memory cell is accessed, the recovery circuit including:

a first transition element configured to transition the second node from the second state to the first state when the first node moves to a first intermediate voltage between the first voltage and the second voltage;

a second transition element configured to transition the second node from the second state to the first state when the first node moves to a second intermediate voltage between the first voltage and the second voltage;

a fifth transition element configured to selectively couple the second node to a source of potential; and a sixth transition element controlled by the voltage at the output node and configured to selectively couple a third node to a source of potential.

11. The memory element of claim 10 further comprising a ninth transition element controlled by the voltage at a fourth node and configured to selectively couple the third node to the first node.

12. The memory element of claim 11 further comprising a tenth transition element controlled by the voltage at a fifth node and configured to selectively couple the third node to the first node.

13. The memory of claim 12, wherein the first transition element is a first transistor having its source and drain coupled between the second node and a sixth node and its gate coupled to the first node.

14. The memory of claim 13, wherein the second transition element is a second transistor having its source and drain coupled between the second node and the sixth node and its gate coupled to the first node.

15. The memory of claim 14, wherein the third transition element is a third transistor having its source and drain coupled between the second node and the second transistor.

16. The memory of claim 15, wherein the fourth transition element is a fourth transistor having its drain coupled to the third node, its source coupled to ground and its gate coupled to the first node.

17. The memory of claim 16, wherein the fifth transition element is a fifth transistor having its drain coupled to a source of potential, its source coupled to the second node and its gate coupled to the third node.

18. The memory of claim 17, wherein the sixth transition element is a sixth transistor having its drain coupled to a source of potential and its gate coupled to the output node.

19. The memory of claim 18, wherein the seventh transition element is a seventh transistor having its drain coupled to the source of the sixth transistor, its drain coupled to the third node and its gate coupled to a seventh node.

20. The memory of claim 19, wherein the eighth transition element is a eighth transistor having its drain coupled to a source of potential and its source and gate coupled to the third node.

21. The memory of claim 20, wherein the ninth transition element is a ninth transistor having its drain coupled to the third node, its source coupled to the first node and its gate coupled to the fourth node.

22. The memory of claim 21, wherein the tenth transition element is a tenth transistor with its drain coupled to the third node, its source coupled to the first node and its gate coupled to the fifth node.

23. The memory of claim 22, wherein the turn-on voltage of the first transistor is higher than the turn-on voltage of the second transistor.

24. The memory of claim 23, wherein the second transistor is a native device.

25. A method for operating a memory, the memory including
   a memory cell,
   a first node coupled to the memory cell, the first node configured to move, depending on the state of the memory cell, to either a first voltage or a second voltage when the memory cell is accessed, and to the first voltage when the memory cell is not accessed and
   a second node coupled to the first node, the second node configured to assume, depending on the state of the memory cell, either a first state or a second state when the memory cell is accessed, and configured to assume the first state when the memory cell is not accessed,
   the method including a resetting step for resetting the second node from the second state to the first state when the second node assumes the second state after the memory cell is accessed, the resetting step including the sub-steps of:
      causing the second node to transition from the second state to the first state when the first node moves to a first intermediate voltage between the first voltage and the second voltage; and
      causing the second node to transition from the second state to the first state when the first node moves to a second intermediate voltage between the first voltage and the second voltage.

26. The method of claim 25, wherein the resetting step further includes the sub-step of:
   selectively enhancing charging of the second node to cause faster voltage transitions on the second node.

27. The method of claim 25, wherein the resetting step further includes the sub-step of:
   selectively enhancing charging of the first node to cause faster voltage transitions on the first node.

\* \* \* \* \*